(12) United States Patent
Park et al.

(10) Patent No.: US 11,508,801 B2
(45) Date of Patent: Nov. 22, 2022

(54) DISPLAY DEVICE

(71) Applicant: Samsung Display Co., LTD., Yongin-si (KR)

(72) Inventors: Jun Hyun Park, Suwon-si (KR); Min Jae Jeong, Hwaseong-si (KR); Seon Young Choi, Gunpo-si (KR); Jun Ki Jeong, Yongin-si (KR); Jae Hyung Cho, Suwon-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 0 days.

(21) Appl. No.: 17/210,279

(22) Filed: Mar. 23, 2021

(65) Prior Publication Data

US 2021/0408208 A1 Dec. 30, 2021

(30) Foreign Application Priority Data

Jun. 24, 2020 (KR) .................. 10-2020-0077183

(51) Int. Cl.
*H01L 27/32* (2006.01)
*G09G 3/3225* (2016.01)
*G09G 3/3233* (2016.01)

(52) U.S. Cl.
CPC ....... *H01L 27/3276* (2013.01); *G09G 3/3233* (2013.01); *G09G 2300/0426* (2013.01); *G09G 2300/0809* (2013.01); *G09G 2320/0233* (2013.01); *H01L 27/3218* (2013.01)

(58) Field of Classification Search
None
See application file for complete search history.

(56) References Cited

U.S. PATENT DOCUMENTS

2007/0115226 A1 5/2007 Jung et al.
2021/0408160 A1* 12/2021 Yuan .................. H01L 27/3265

FOREIGN PATENT DOCUMENTS

| JP | 6225511 B2 | 11/2017 |
| KR | 100688971 B1 | 3/2007 |
| KR | 1020160129176 A | 11/2016 |
| KR | 1020170058492 A | 5/2017 |
| KR | 101937768 B1 | 1/2019 |

OTHER PUBLICATIONS

Extended European Search Report-European Application EP 21181181.5 dated Nov. 2, 2021.

* cited by examiner

*Primary Examiner* — Carl Adams
(74) *Attorney, Agent, or Firm* — Cantor Colburn LLP

(57) ABSTRACT

A display device includes: scan lines extending in a first direction; data lines extending in a second direction intersecting the first direction and receiving data voltages; first driving voltage lines extending in the second direction and receiving a first driving voltage; second driving voltage lines extending in the second direction and receiving a second driving voltage different from the first driving voltage; and pixels connected to the scan and data lines. Each of the pixels includes first, second, and third subpixels arranged in the first direction. The first driving voltage lines and the second driving voltage lines are alternately arranged in the first direction. A location of the first driving voltage line in a first pixel differs from a location of the second driving voltage line in a second pixel. The second pixel is adjacent to the first pixel in the first direction.

32 Claims, 24 Drawing Sheets

DISPLAY DEVICE

This application claims priority to Korean Patent Application No. 10-2020-0077183 filed on Jun. 24, 2020, and all the benefits accruing therefrom under 35 U.S.C. § 119, the content of which in its entirety is herein incorporated by reference.

BACKGROUND

1. Field

Embodiments of the invention relate to a display device.

2. Description of the Related Art

As the information society has developed, the demand for display devices for displaying images has diversified. For example, display devices have been applied to various electronic devices such as smart phones, digital cameras, notebook computers, navigation systems, and smart televisions ("TVs"). Examples of display devices include flat panel display devices such as liquid crystal display ("LCD") devices, field emission display ("FED") devices, or light-emitting diode ("LED") display devices.

A light-emitting display device includes, in each subpixel of a display panel, a light-emitting element that is capable of emitting light by itself, and can thus display an image without the need of a backlight unit that provides light to the display panel. Each subpixel of the light-emitting display device may include a light-emitting element, a driving transistor, which controls the amount of driving current to be applied from a driving voltage line to the light-emitting element in accordance with a data voltage from a data line, and a plurality of switching transistors, which are turned on in response to a scan signal from a scan line. If the driving transistor is disposed adjacent to a data line connected to a neighboring subpixel, the driving transistor may be affected by the data line of the neighboring subpixel.

SUMMARY

Embodiments of the invention provide a display device capable of preventing or suppressing driving transistors of subpixels from being affected by data lines connected to their respective neighboring subpixels.

An embodiment of the invention provides a display device includes: scan lines extending in a first direction; data lines extending in a second direction that intersects the first direction and which receive data voltages; first driving voltage lines extending in the second direction and which receive a first driving voltage; second driving voltage lines extending in the second direction and which receive a second driving voltage, where the second driving voltage is different from the first driving voltage; and pixels connected to the scan lines and the data lines. Each of the pixels includes first, second, and third subpixels, which are arranged in the first direction. The first driving voltage lines and the second driving voltage lines are alternately arranged in the first direction. A location of one of the first driving voltage lines in a first pixel among the pixels differs from a location of one of the second driving voltage lines in a second pixel among the pixels. The second pixel is adjacent to the first pixel in the first direction.

At least one of the first driving voltage lines and the second driving voltage lines may be disposed in each of the pixels.

The first driving voltage lines and the second driving voltage lines may be alternately arranged in the first direction between the first and second subpixels of a (3N−2)-th pixel among the pixels (where N is a positive integer), between the second and third subpixels of a (3N−1)-th pixel among the pixels, and between the third subpixel of a 3N-th pixel and the first subpixel of a (3N+1)-th pixel among the pixels.

The one of the first driving voltage lines may be disposed between the first and second subpixels of the first pixel, and the one of the second driving voltage lines may be disposed between the second and third subpixels of the second pixel.

Another of the first driving voltage lines may be disposed between the third subpixel of a third pixel among the pixels and the first subpixel of a fourth pixel among the pixels. Another of the second driving voltage lines may be disposed between the first subpixel and the second subpixel of the fourth pixel. The third pixel may be adjacent to the second pixel in the first direction. The fourth pixel may be adjacent to the third pixel in the first direction.

Still another of the first driving voltage lines may be disposed between the second and third subpixels of a fifth pixel among the pixels, still another of the second driving voltage lines is disposed between the third subpixel of a sixth pixel among the pixels and the first subpixel of a seventh pixel among the pixels, the fifth pixel may be adjacent to the fourth pixel in the first direction, the sixth pixel may be adjacent to the fifth pixel in the first direction, and the seventh pixel may be adjacent to the sixth pixel in the first direction.

The first driving voltage lines and the second driving voltage lines may be alternately arranged in the first direction between the first and second subpixels of a (2N−1)-th pixel (where N is a positive integer) and between the second and third subpixels of a 2N-th pixel.

The location of the one of the first driving voltage lines in the first pixel among the pixels may be between a first transistor of the one of the subpixels and a data line among the data lines, connected to an next subpixel in the first pixel.

Another of the first driving voltage lines may be disposed between the first and second subpixels of a third pixel among the pixels. Another of the second driving voltage lines may be disposed between the second and third subpixels of a fourth pixel among the pixels. The third pixel may be adjacent to the second pixel in the first direction. The fourth pixel may be adjacent to the third pixel in the first direction.

The first driving voltage lines and the second driving voltage lines may be alternately arranged in the first direction between the second and third subpixels of a (2N−1)-th pixel (where N is a positive integer), between the first and second subpixels of a 2N-th pixel, and between the third subpixel of the 2N-th pixel and the first subpixel of a (2N+1)-th pixel.

The one of the first driving voltage lines may be disposed between the second and third subpixels of the first pixel. The one of the second driving voltage lines may be disposed between the first and second subpixels of the second pixel.

Another of the first driving voltage lines may be disposed between the third subpixel of the second pixel and the first subpixel of a third pixel among the pixels. Another of the second driving voltage lines may be disposed between the second and third subpixels of the third pixel. The third pixel may be adjacent to the second pixel in the first direction.

Still another of the first driving voltage lines may be disposed between the first and second subpixels of a fourth pixel among the pixels. Still another of the second driving voltage lines may be disposed between the third subpixel of the fourth pixel and the first subpixel of a fifth pixel among the pixels, The fourth pixel may be adjacent to the third pixel in the first direction, and the fifth pixel may be adjacent to the fourth pixel in the first direction.

An embodiment of the invention provides a display device includes: scan lines extending in a first direction; data lines extending in a second direction that intersects the first direction and which receive data voltages; first driving voltage lines extending in the second direction and which receive a first driving voltage; second driving voltage lines extending in the second direction and which receive a second driving voltage, where the second driving voltage is different from the first driving voltage; third driving voltage lines extending in the second direction, the third driving voltage lines to which a third driving voltage applied, the third driving voltage being different from the first and second driving voltages; and pixels connected to the scan lines and the data lines. Each of the pixels includes first, second, and third subpixels, which are arranged in the first direction. The first driving voltage lines, the second driving voltage lines, and the third driving voltage lines are alternately arranged in the first direction. A location of one of the first driving voltage lines in a first pixel among the pixels differs from a location of one of the second driving voltage lines in a second pixel among the pixels. The second pixel is adjacent to the first pixel in the first direction. At least one of the first driving voltage lines, the second driving voltage lines. The third driving voltage lines are disposed in each of the pixels.

A location of one of the third driving voltage lines in a third pixel among the pixels may differ from the location of the first driving voltage line in the first pixel and the location of the second driving voltage line in the second pixel.

The first driving voltage lines, the second driving voltage lines, and the third driving voltage lines may be alternately arranged in the first direction between the first and second subpixels of a (3N−2)-th pixel (where N is a positive integer), between the second and third subpixels of a (3N−1)-th pixel, and between the third subpixel of a 3N-th pixel and the first subpixel of a (3N+1)-th pixel.

A location of one of the third driving voltage lines in a third pixel among the pixels may be the same as the location of the first driving voltage line in the first pixel and different from the location of the second driving voltage line in the second pixel.

The first driving voltage lines, the second driving voltage lines, and the third driving voltage lines may be alternately arranged in the first direction between the first and second subpixels of a (2N−1)-th pixel (where N is a positive integer) and between the second and third subpixels of a 2N-th pixel.

The location of the second driving voltage line in the second pixel may differ from the location of the first driving voltage line in the first pixel and a location of one of the third driving voltage lines in the second pixel.

The first driving voltage lines, the second driving voltage lines, and the third driving voltage lines may be alternately arranged in the first direction between the second and third subpixels of a (2N−1)-th pixel (where N is a positive integer), between the first and second subpixels of a 2N-th pixel, and between the third subpixel of the 2N-th pixel and the first subpixel of a (2N+1)-th pixel.

Each of the first, second, and third subpixels may include: a first transistor which controls a driving current that flows between first and second electrodes of the first transistor in accordance with a voltage applied to a gate electrode of the first transistor; a light-emitting element connected between the first transistor and one of the first driving voltage lines; a second transistor connected between a first electrode of the light-emitting element and one of the second driving voltage lines; and a first capacitor connected between a second electrode of the first transistor and a third transistor, where the third transistor is connected between the first capacitor and one of the third driving voltage lines.

An embodiment of the invention provides a display device includes: scan lines extending in a first direction; data lines extending in a second direction that intersects the first direction and which receive data voltages; first driving voltage lines extending in the second direction and which receive a first driving voltage; second driving voltage lines extending in the second direction and which receive a second driving voltage, where the second driving voltage is different from the first driving voltage; and pixels connected to the scan lines and the data lines. Each of the pixels includes first, second, third, and fourth subpixels, which are arranged in the first direction. One of the first driving voltage lines and one of the second driving voltage lines are disposed in each of the pixels.

The first driving voltage lines and the second driving voltage lines may be alternately arranged in the first direction.

The first driving voltage lines and the second driving voltage lines may be alternately arranged in the first direction between the first and second subpixels of a (2N−1)-th pixel (where N is a positive integer), between the fourth subpixel of the (2N−1)-th pixel and the first subpixel of a 2N-th pixel, between the third and fourth subpixels of the 2N-th pixel, and between the fourth subpixel of the 2N-th pixel and the first subpixel of a (2N+1)-th pixel.

The first driving voltage lines and the second driving voltage lines may be alternately arranged in the first direction between the second and third subpixels of a (2N−1)-th pixel (where N is a positive integer), between the fourth subpixel of the (2N−1)-th pixel and the first subpixel of a 2N-th pixel, between the second and third subpixels of the 2N-th pixel, and between the fourth subpixel of the 2N-th pixel and the first subpixel of a (2N+1)-th pixel.

The display device may further include: third driving voltage lines extending in the second direction and which receive a third driving voltage, where the third driving voltage may be different from each of the first and second driving voltages. The first driving voltage lines, the second driving voltage lines, and the third driving voltage lines may be alternately arranged in the first direction.

The first driving voltage lines, the second driving voltage lines, and the third driving voltage lines may be alternately arranged in the first direction between the first and second subpixels of a (2N−1)-th pixel (where N is a positive integer), between the fourth subpixel of the (2N−1)-th pixel and the first subpixel of a 2N-th pixel, between the third and fourth subpixels of the 2N-th pixel, and between the fourth subpixel of the 2N-th pixel and the first subpixel of a (2N+1)-th pixel.

The first driving voltage lines, the second driving voltage lines, and the third driving voltage lines may be alternately arranged in the first direction between the second and third subpixels of a (2N−1)-th pixel (where N is a positive integer), between the fourth subpixel of the (2N−1)-th pixel and the first subpixel of a 2N-th pixel, between the second and third subpixels of the 2N-th pixel, and between the fourth subpixel of the 2N-th pixel and the first subpixel of a (2N+1)-th pixel.

An embodiment of the invention provides a display device includes: scan lines extending in a first direction; data lines extending in a second direction that intersects the first direction and which receive data voltages; driving voltage lines extending in the second direction and which receive driving voltages; and subpixels connected to the scan lines, the data lines, and the driving voltage lines. Each of the subpixels may include a first transistor, which controls a driving current that flows between first and second electrodes of the first transistor in accordance with a voltage applied to a gate electrode of the first transistor. One of the driving voltage lines may be disposed between the first transistor of one of the subpixels and a data line, among the data lines, adjacent to a data line connected to the one of the subpixels.

The each of the subpixels may further include a first capacitor connected between a second electrode of the first transistor and a third transistor, where the third transistor is connected between the first capacitor and one of the driving voltage lines.

The each of the subpixels may further include a light-emitting element, which is connected between the first transistor and one of the driving voltage lines.

The each of the subpixels may further include a light-emitting element, which emits light in accordance with the driving current of the first transistor, and a second transistor, which is connected between a first electrode of the light-emitting element and one of the driving voltage lines.

BRIEF DESCRIPTION OF THE DRAWINGS

These and/or other features of the invention will become apparent and more readily appreciated by describing in further detail embodiments thereof with reference to the accompanying drawings, in which.

DETAILED DESCRIPTION

Figure 1:
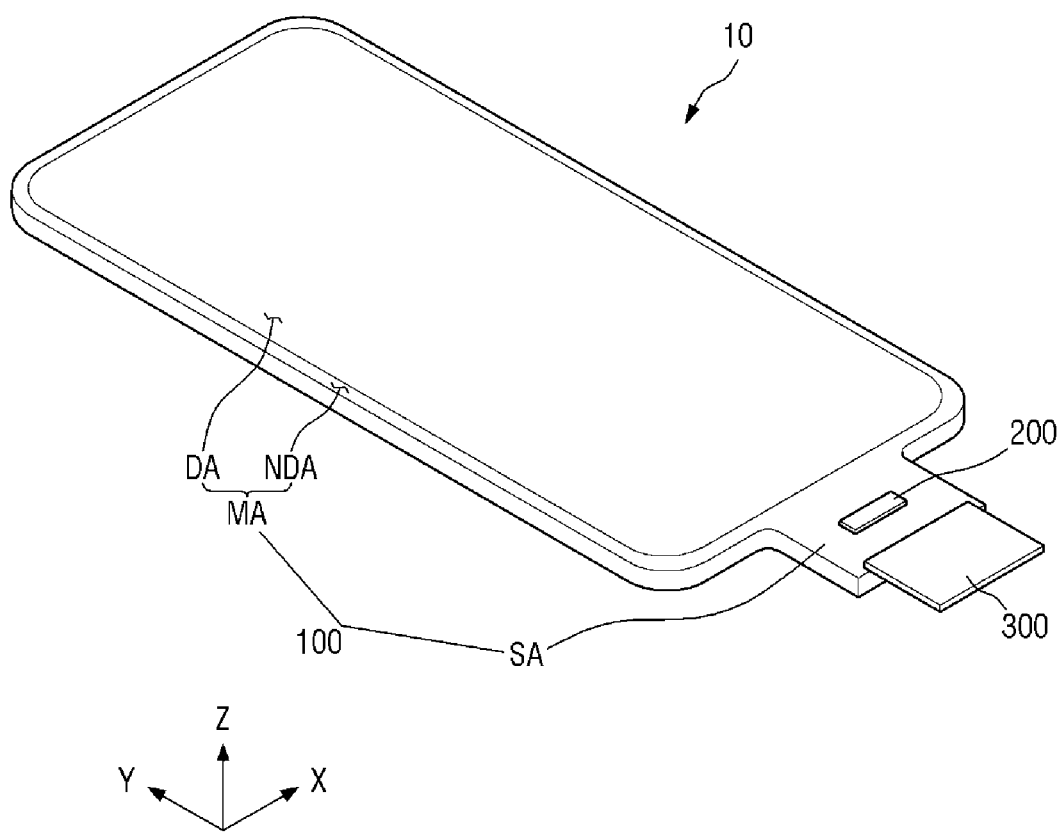
FIG. 1 is a perspective view of a display device according to an embodiment of the present disclosure.

The invention will now be described more fully hereinafter with reference to the accompanying drawings, in which embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached drawing figures, the thickness of layers and regions is exaggerated for clarity.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

It will also be understood that when a layer is referred to as being "on" another layer or substrate, it can be directly on the other layer or substrate, or intervening layers may also be present. In contrast, when an element is referred to as being "directly on" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least one of A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. A region illustrated or described as flat may, typically, have rough and/or nonlinear features, for example. Moreover, sharp angles that are illustrated may be rounded. Thus, the regions illustrated in the drawing figures are schematic in nature and their shapes are not intended to illustrate the precise shape of a region and are not intended to limit the scope of the claims.

Hereinafter, embodiments of the invention will be described in detail with reference to the accompanying drawings.

FIG. 1 is a perspective view of a display device according to an embodiment of the present disclosure.

Referring to FIG. 1, a display device 10, which is a device for displaying a moving or still image, may be used not only as the display screens of portable electronic devices such as a mobile phone, a smartphone, a tablet personal computer ("PC"), a smartwatch, a watchphone, a mobile communication terminal, an electronic notepad, an electronic book, a portable multimedia player ("PMP"), a navigation system, and an ultra-mobile PC ("UMPC"), but also as the display screens of various other products such as a television ("TV"), a notebook computer, a monitor, a billboard, and an Internet-of-things ("IoT") device.

The display device 10 may be an organic light-emitting diode ("OLED") display device using OLEDs, an inorganic light-emitting diode ("ILED") display device using an inorganic semiconductor, or a micro-light-emitting diode ("micro-LED") display device using micro-LEDs. The display device 10 will hereinafter be described as being an OLED display device, as an example, but the present disclosure according to the invention is not limited thereto.

The display device 10 includes a display panel 100, a display driving circuit 200, and a circuit board 300.

The display panel 100 may have a substantially rectangular shape having short sides in a first direction (i.e., an X-axis direction) and long sides in a second direction (i.e., a Y-axis direction) in a plan view. The corners at which the short sides in the first direction (i.e., the X-axis direction) and the long sides in the second direction (i.e., the Y-axis direction) meet may be rounded to have a predetermined curvature or may be right-angled. The planar shape of the display panel 100 according to the invention is not particularly limited, and the display panel 100 may have various other shapes such as a polygonal shape other than a rectangular shape, a circular shape, or an elliptical shape. The display panel 100 may be flat, but the present disclosure according to the invention is not limited thereto. Alternatively, the display panel 100 may include curved parts that are formed at both ends of the display panel 100 and have a uniform or varying curvature. The display panel 100 may be flexible, for example, bendable, foldable, or rollable.

The display panel 100 may include a main area MA and a sub-area SA.

The main area MA may include a display area DA, which displays an image, and a non-display area NDA, which is on the periphery of the display area DA and does not display and an image. The non-display area NDA may be defined as an area that ranges from the edges of the display area DA to the edges of the display panel 100.

The sub-area SA may protrude from one side of the main area MA in the second direction (or the Y-axis direction). The length, in the first direction (or the X-axis direction), of the sub-area SA may be smaller than the length, in the first direction (or the X-axis direction), of the main area MA, and the length, in the second direction (or the Y-axis direction), of the sub-area SA may be smaller than the length, in the second direction (or the Y-axis direction), of the main area MA. However, the present disclosure according to the invention is not limited to this.

FIG. 1 illustrates that the sub-area SA is unfolded, but the sub-area SA may be folded down to be placed on the bottom surface of the display panel 100. When the sub-area SA is folded down, the sub-area SA may overlap with the main area MA in the thickness direction (i.e., a Z-axis direction) of a substrate SUB. The display driving circuit 200 may be disposed in the sub-area SA.

The display driving circuit 200 may include or be formed as an integrated circuit ("IC") and may be attached on the display panel 100 in a chip-on-glass ("COG") or chip-on-plastic ("COP") manner or via ultrasonic bonding, but the present disclosure according to the invention is not limited thereto. Alternatively, the display driving circuit 200 may be attached on the circuit board 300 in a chip-on-film ("COF") manner.

The circuit board 300 may be attached to one end of the sub-area SA of the display panel 100 via an anisotropic conductive film. As a result, the circuit board 300 may be electrically connected to the display panel 100 and the display driving circuit 200. The circuit board 300 may be a flexible film such as a flexible printed circuit board, a printed circuit board, or a COF.

Figure 2:
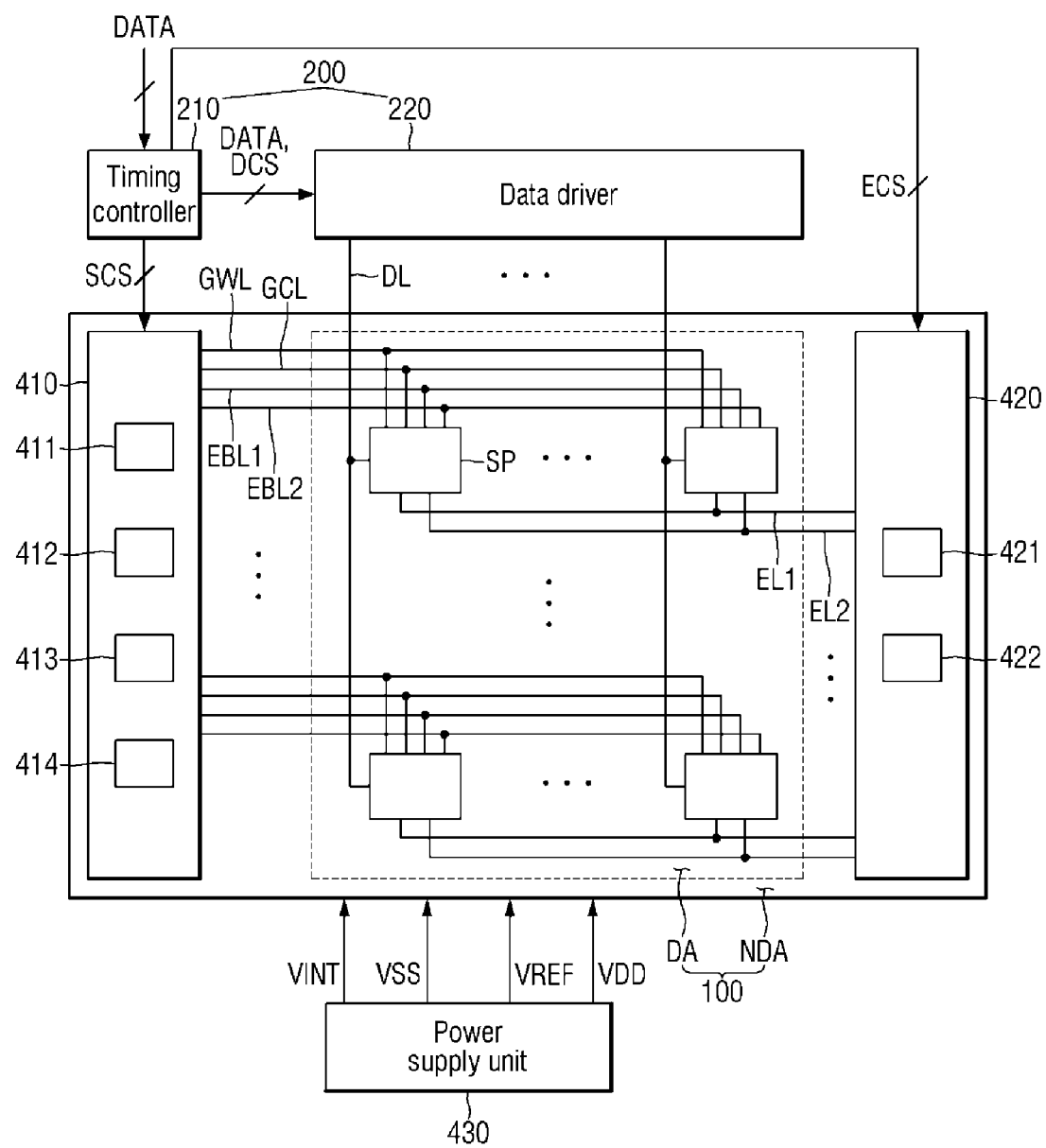
FIG. 2 is a block diagram of the display device of FIG. 1.

FIG. 2 is a block diagram of the display device of FIG. 1.

Referring to FIG. 2, the display device 10 further includes a scan driving unit 410, an emission driving unit 420, and a power supply unit 430. The display device 10 may further include a timing controller 210 and a data driver 220.

In the display area DA of the display panel 100, not only subpixels SP, but also scan lines, first emission lines EL1, second emission lines EL2, and data lines DL that are connected to the subpixels SP, may be disposed. The scan lines may include scan write lines GWL, scan control lines GCL, first scan bias lines EBL1, and second scan bias lines EBL2.

The scan write lines GWL, the scan control lines GCL, the first scan bias lines EBL1, and the second scan bias lines EBL2 may extend in the first direction (or the X-axis direction). The first emission lines EL1 and the second emission lines EL2 may extend in the first direction (or the X-axis direction). The data lines DL may extend in the second direction (or the Y-axis direction), which intersects the first direction (or the X-axis direction).

Each of the subpixels SP may be connected to one of the scan write lines GWL, one of the scan control lines GCL, one of the first scan bias lines EBL1, one of the second scan bias lines EBL2, one of the first emission lines EL1, one of the second emission lines EL2, and one of the data lines DL.

Each of the subpixels SP may include a driving transistor, one or more switching transistors, a light-emitting element, and a capacitor. The switching transistors may be turned on by a scan write signal from one of the scan write lines GWL and may thus apply a data voltage from one of the data lines DL to the gate electrode of the driving transistor. The driving transistor supplies a driving current to the light-emitting element in accordance with the data voltage applied to the gate electrode thereof. The driving transistor and the switching transistors may be thin-film transistors ("TFTs"). The light-emitting element may emit light in accordance with the driving current of the driving transistor. The light-emitting element may be an OLED including a first electrode, an organic light-emitting flayer, and a second electrode. The capacitor may sustain the data voltage applied to the gate electrode of the driving transistor for a predetermined amount of time. Each of the subpixels SP will be described later in further detail with reference to FIG. 3.

In the non-display area NDA of the display panel 100, the scan driving unit 410, which is for applying signals to the scan write lines GWL, the scan control lines GCL, the first scan bias lines EBL1, and the second scan bias lines EBL2, and the emission driving unit 420, which is for applying signals to the first emission lines EL1 and the second emission lines EL2, may be disposed. The scan driving unit 410 may be disposed on one side of the display panel 100, and the emission driving unit 420 may be disposed on an opposite side of the display panel 100. However, the present disclosure according to the invention is not limited to this.

The scan driving unit 410 may be connected to the timing controller 210 of the display driving circuit 200. The scan driving unit 410 may receive a scan control signal SCS from the timing controller 210.

The scan driving unit 410 may include a scan write signal output portion 411, a scan control signal output portion 412, a first scan bias signal output portion 413, and a second scan bias signal output portion 414. The scan write signal output portion 411 may generate scan write signals in accordance with the scan control signal SCS and may output the scan write signals to the scan write lines GWL. The scan control signal output portion 412 may generate scan control signals in accordance with the scan control signal SCS and may output the scan control signals to the scan control lines GCL. The first scan bias signal output portion 413 may generate first scan bias signals in accordance with the scan control signals SCS and may output the first scan bias signals to the first scan bias lines EBL1. The second scan bias signal output portion 414 may generate second scan bias signals in accordance with the scan control signal SCS and may output the second scan bias signals to the second scan bias lines EBL2.

The emission driving unit 420 may be connected to the timing controller 210 of the display driving circuit 200. The emission driving unit 420 may receive an emission control signal ECS from the timing controller 210.

The emission driving unit 420 may include first and second emission drivers 421 and 422. The first emission driver 421 may generate first emission signals in accordance with the emission control signal ECS and may output the first emission signals to the first emission lines EL1. The second emission driver 422 may generate second emission signals in accordance with the emission control signal ECS and may output the second emission signals to the second emission lines EL2.

The timing controller 210 of the display driving circuit 200 receives digital video data DATA and timing signals from the circuit board 300. The timing controller 210 may generate the scan control signal SCS, which is for controlling the operation timing of the scan driving unit 410, and the emission control signal ECS, which is for controlling the operation timing of the emission driving unit 420, and a data control signal DCS, which is for controlling the operation timing of the data driver 220. The timing controller 210 may output the scan control signal SCS and the emission control signal ECS to the scan driving unit 410 and the emission driving unit 420, respectively. The timing controller 210 may output the digital video data DATA and the data control signal DCS to the data driver 220.

The data driver 220 converts the digital video data DATA into analog (positive/negative) data voltages and outputs the analog data voltages to the data lines DL. As a result, the subpixels SP are selected by the scan write signals from the scan driving unit 410, and the data voltages supplied from the data driver 220 may be supplied to the selected subpixels SP.

The power supply unit 430 may generate a plurality of driving voltages and may provide the driving voltages to the display panel 100. For example, the power supply unit 430 may generate a first driving voltage VSS, a second driving voltage VINT, a third driving voltage VREF, and a fourth driving voltage VDD, and may provide the first driving voltage VSS, the second driving voltage VINT, the third driving voltage VREF, and the fourth driving voltage VDD to the display panel 100. The first driving voltage VSS, the second driving voltage VINT, the third driving voltage VREF, and the fourth driving voltage VDD will be described later in detail with reference to FIG. 3.

Figure 3:
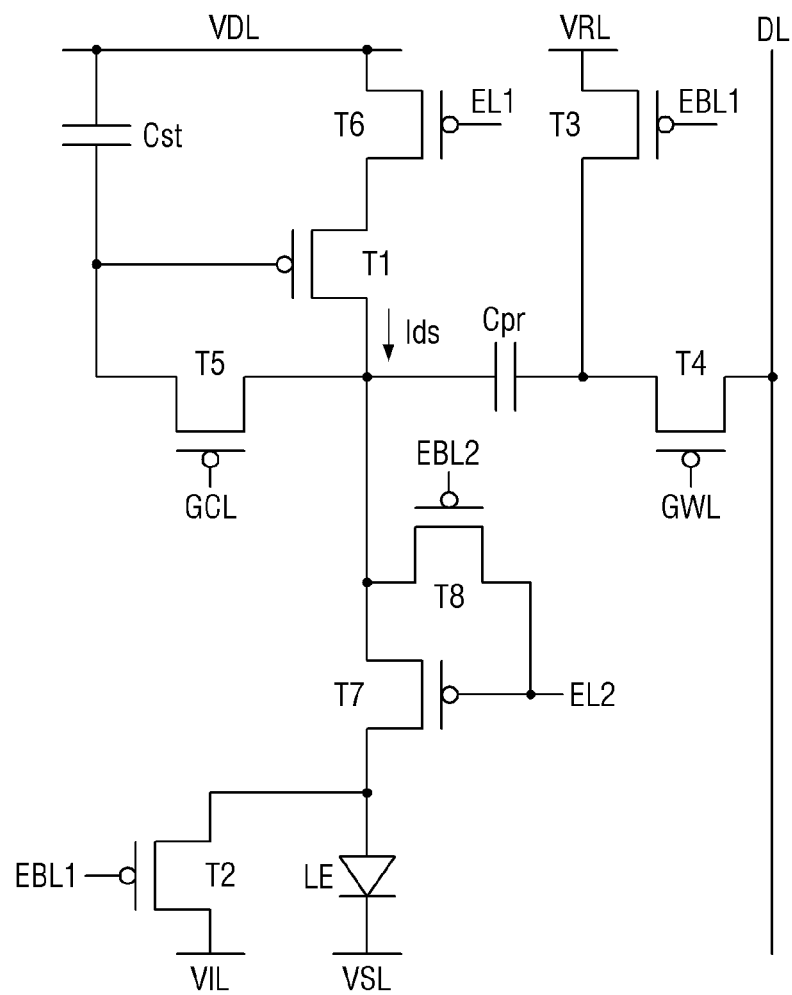
FIG. 3 is a circuit diagram of a subpixel according to an embodiment of the present disclosure.

FIG. 3 is a circuit diagram of a subpixel according to an embodiment of the present disclosure.

Referring to FIG. 3, a subpixel SP may be connected to a scan write line GWL, a scan control line, a first scan bias line EBL1, a second scan bias line EBL2, a first emission line EL1, a second emission line EL2, and a data line DL. Also, the subpixel SP may be connected to a first driving voltage line VSL to which a low-potential voltage, i.e., the first driving voltage VSS, is provided, a second driving voltage line VIL to which an initialization voltage, i.e., the second driving voltage VINT, is applied, a third driving voltage line VRL to which a reference voltage, i.e., the third driving voltage VREF, is applied, and a fourth driving voltage line VDL to which a high-potential voltage, i.e., the fourth driving voltage VDD, is applied. That is, the first driving voltage line VSL may be a low-potential voltage line, the second driving voltage line VINT may be an initialization voltage line, the third driving voltage line VRL may be a reference voltage line, and the fourth driving voltage line VDL may be a high-potential voltage line. The first driving voltage VSS may be lower than the second driving voltage VINT. The third driving voltage VREF may be higher than the fourth driving voltage VDD. The fourth driving voltage VDD may be higher than the second driving voltage VINT.

The subpixel SP may include a plurality of first through eighth transistors T1 through T8, a light-emitting element LE, a first capacitor Cpr, and a second capacitor Cst.

The first transistor T1 may include a gate electrode, a first electrode, and a second electrode. The first transistor T1 may be a driving transistor that controls a drain-source current (hereinafter, referred to as the driving current Ids), which flows between the first and second electrodes of the first transistor T1 in accordance with a data voltage applied to the gate electrode of the first transistor T1. The driving current Ids, which flows through the channel of first transistor T1, is proportional to the square of the difference between a gate-source voltage Vgs of the first transistor T1 and a threshold voltage, as indicated by Equation (1):

$$Ids = k' \times (Vgs - Vth)^2 \qquad (1)$$

where k' denotes a proportional coefficient determined by the structure and the physical characteristics of the first transistor T1, Vgs denotes the gate-source voltage of the first transistor T1, and Vth denotes the threshold voltage of the first transistor T1.

The light-emitting element LE emits light in accordance with the driving current Ids. The amount of light emitted by the light-emitting element LE may be proportional to the driving current Ids. The light-emitting element LE may be disposed between the seventh transistor T7 and the first driving voltage line VSL. The first electrode of the light-emitting element LE may be connected to the second electrode of the seventh transistor T7, and the second electrode of the light-emitting element LE may be connected to the second driving voltage line VSL. The first electrode of the light-emitting element LE may be an anode electrode, and the second electrode of the light-emitting element LE may be a cathode electrode.

The light-emitting element LE may be an OLED including a first electrode, a second electrode, and an organic light-emitting layer, which is disposed between the first and second electrodes. Alternatively, the light-emitting element LE may be an ILED including a first electrode, a second electrode, an inorganic semiconductor, which is disposed between the first and second electrodes. Alternatively, the light-emitting element LE may be a quantum-dot light-emitting element including a first electrode, a second electrode, and a quantum-dot light-emitting layer, which is disposed between the first and second electrodes. Alternatively, the light-emitting element LE may be a micro-LED.

The second transistor T2 may be disposed between the first electrode of the light-emitting element LE and the second driving voltage line VIL. The second transistor T2 may be turned on by a first scan bias signal from the first scan bias line EBL1 to connect the first electrode of the light-emitting element LE to the second driving voltage line VIL. As a result, the second driving voltage VINT from the second driving voltage line VIL may be applied to the first electrode of the light-emitting element LE. The first scan bias line EBL1 may be connected to the gate electrode of the second transistor T2, the first electrode of the second transistor T2 may be connected to the first electrode of the light-emitting element LE, and the second electrode of the second transistor T2 may be connected to the second driving voltage line VIL.

The third transistor T3 may be disposed between the first electrode of the first capacitor Cpr and the third driving voltage line VRL. The third transistor T3 may be turned on by the first scan bias signal from the first scan bias line EBL1 to connect the first electrode of the first capacitor Cpr to the third driving voltage line VRL. As a result, the third driving voltage VREF from the third driving voltage line VRL may be applied to the first electrode of the first capacitor Cpr. The gate electrode of the third transistor T3 may be connected to the first scan bias line EBL1, the first electrode of the third transistor T3 may be connected to the first electrode of the first capacitor Cpr, and the second electrode of the third transistor T3 may be connected to the third driving voltage line VRL.

The fourth transistor T4 may be disposed between the first electrode of the first capacitor Cpr and the data line DL. The fourth transistor T4 may be turned on by a scan write signal from the scan write line GWL to connect the first electrode of the first capacitor Cpr to the data line DL. As a result, a data voltage from the data line DL may be applied to the first electrode of the first capacitor Cpr. The gate electrode of the fourth transistor T4 may be connected to the scan write line GWL, the first electrode of the fourth transistor T4 may be connected to the first electrode of the first capacitor Cpr, and the second electrode of the fourth transistor T4 may be connected to the data line DL.

The fifth transistor T5 may be disposed between the first and second electrodes of the first transistor T1. The fifth transistor T5 may be turned on by a scan control signal from the scan control line GCL to connect the first electrode of the first transistor T1 to the second electrode of the first transistor T1. That is, when the fifth transistor T5 is turned on, the gate electrode and the second electrode of the first transistor T1 are connected, and as a result, the first transistor T1 operates as a diode. The gate electrode of the fifth transistor T5 may be connected to the scan control line GCL, the first electrode of the fifth transistor T5 may be connected to the second electrode of the first transistor ST1, and the second electrode of the fifth transistor T5 may be connected to the gate electrode of the first transistor T1.

The sixth transistor T6 may be disposed between the first electrode of the first transistor T1 and the fourth driving voltage line VDL. The sixth transistor T6 may be turned on by a first emission signal from the first emission line EL1 to connect the first electrode of the first transistor T1 to the fourth driving voltage line VDL. As a result, the fourth driving voltage VDD from the fourth driving voltage line VDL may be applied to the first electrode of the first transistor T1. The gate electrode of the sixth transistor T6 may be connected to the first emission line EL1, the first electrode of the sixth transistor T6 may be connected to the fourth driving voltage line VDL, and the second electrode of the sixth transistor T6 may be connected to the first electrode of the first transistor T1.

The seventh transistor T7 may be connected between the second electrode of the first transistor T1 and the first electrode of the light-emitting element LE. The seventh transistor T7 may be turned on by a second emission signal from the second emission line EL2 to connect the second electrode of the first transistor T1 to the first electrode of the light-emitting element LE. The gate electrode of the seventh transistor T7 may be connected to the second emission line EL2, the first electrode of the seventh transistor T7 may be connected to the second electrode of the first transistor T1, and the second electrode of the seventh transistor T7 may be connected to the first electrode of the light-emitting element LE. When the sixth and seventh transistors T6 and T7 are both turned on, the driving current Ids may be provided to the light-emitting element LE.

The eighth transistor T8 may be connected between the second electrode of the first transistor T1 and the second emission line EL2. The eighth transistor T8 is turned on by a second scan bias signal from the second scan bias line EBL2 to connect the second electrode of the first transistor T1 to the second emission line EL2. The gate electrode of the eighth transistor T8 may be connected to the second scan bias line EBL2, the first electrode of the eighth transistor T8 may be connected to the second emission line EL2, and the second electrode of the eighth transistor T8 may be connected to the second electrode of the first transistor T1.

The first capacitor Cpr may be formed between the second electrode of the first transistor T1 and the first electrode of the third transistor T3. The first electrode of the first capacitor Cpr may be connected to the first electrode of the third transistor T3, and the second electrode of the first capacitor Cpr may be connected to the second electrode of the first transistor T1.

The second capacitor Cst is formed between the first electrode of the first transistor T1 and the fourth driving voltage line VDL. The first electrode of the second capacitor Cst may be connected to the first electrode of the first transistor T1, and the second electrode of the second capacitor Cst may be connected to the fourth driving voltage line VDL.

One of the first and second electrodes of each of the first through eighth transistors T1 through T8 may be a source electrode, and the other electrode of each of the first through eight transistors T1 through T8 may be a drain electrode. The active layers of the first through eighth transistors T1 through T8 may include or be formed of any one of polysilicon, amorphous silicon, or an oxide semiconductor. In a case where the semiconductor layers of the first through eighth transistors T1 through T8 include or are formed of polysilicon, the semiconductor layers of the first through eighth transistors T1 through T8 may include or be formed by a low-temperature polysilicon ("LTPS") process.

FIG. 3 illustrates that the first through eighth transistors T1 through T8 are P-type metal-oxide semiconductor field-effect transistors ("MOSFETs"), but the present disclosure according to the invention is not limited thereto. Alternatively, the first through eighth transistors T1 through T8 may be N-type MOSFETs.

FIG. 3 illustrates that the subpixel SP includes eight transistors and two capacitors, but the configuration of the subpixel SP according to the invention is not limited to that illustrated in FIG. 3.

Figure 4:
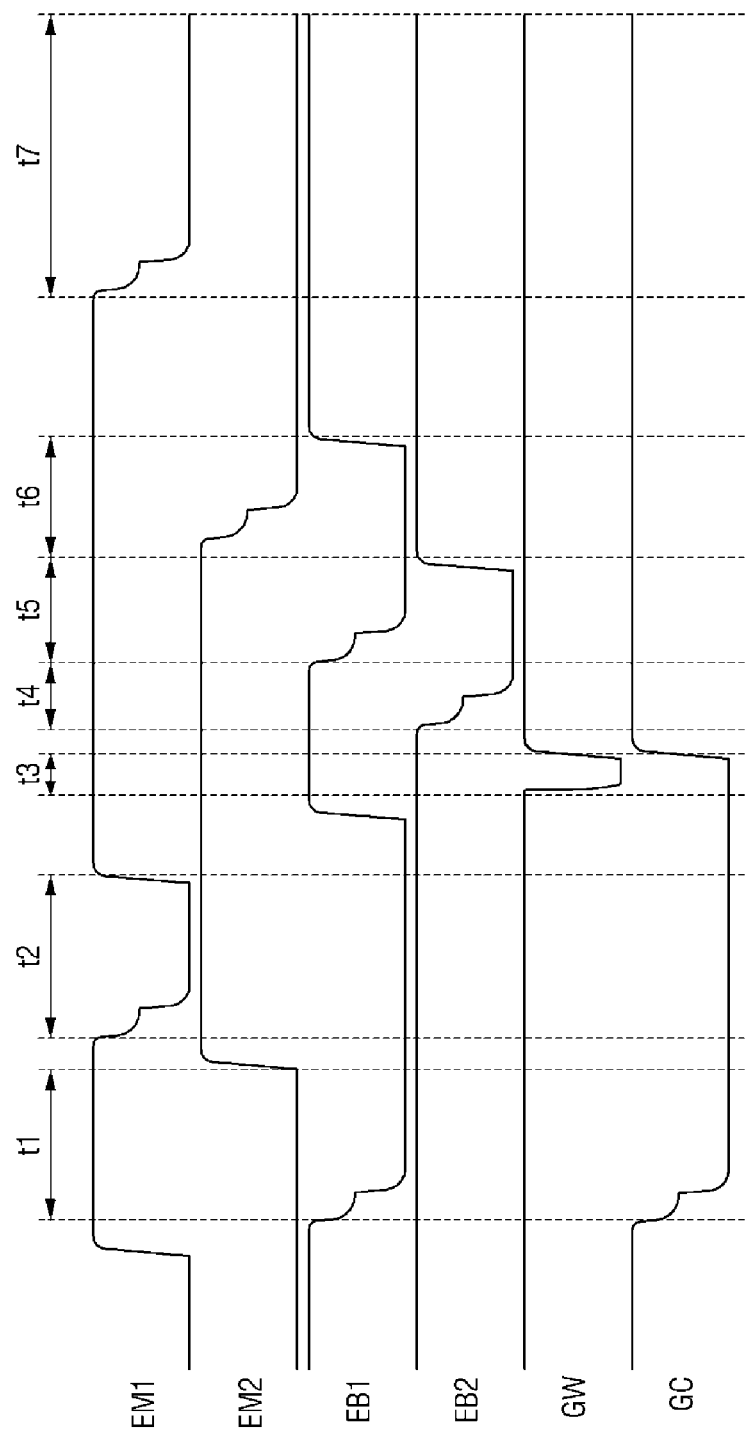
FIG. 4 is a waveform diagram illustrating signals applied to the subpixel of FIG. 3.

FIG. 4 is a waveform diagram illustrating signals applied to the subpixel of FIG. 3.

FIG. 4 illustrates a scan write signal GW, a scan control signal GC, a first scan bias signal EB1, a second scan bias signal EB2, a first emission signal EM1, and a second emission signal EM2 from the scan write line GWL, the scan control line GCL, the first scan bias line EBL1, the second scan bias line EBL2, the first emission signal EM1, and the second emission line EM2, respectively, that are connected to the subpixel SP of FIG. 3.

Referring to FIG. 4, the scan write signal GW is a signal for controlling the turning on or off of the fourth transistor T4. The scan control signal GC is a signal for turning on or off of the fifth transistor T5. The first scan bias signal EB1 is a signal for controlling the turning on or off of the second and third transistors T2 and T3. The second scan bias signal EB2 is a signal for controlling the turning on or off of the eighth transistor T8. The first emission signal EM1 is a signal for controlling the turning on or off of the sixth transistor T6. The second emission signal EM2 is a signal for controlling the turning on or off of the seventh transistor T7.

The scan write signal GW, the scan control signal GC, the first scan bias signal EB1, the second scan bias signal EB2, the first emission signal EM1, and the second emission signal EM2 may be generated at intervals of a first frame period. The first frame period may include first through seventh periods t1 through t7. The first period t1 may be a period during which the gate electrode of the first transistor T1 is initialized, the second period t2 may be a period during which a threshold voltage is sampled to the gate electrode of the first transistor T1, the third period t3 may be a period during which a data voltage is supplied to the gate electrode of the first transistor T1, the fourth through sixth periods t4 through t6 may be periods during which an on-bias voltage is applied to the first transistor T1 and the first electrode of the light-emitting element LE is initialized, and the seventh period t7 is a period during which the light-emitting element LE emits light in accordance with the driving current Ids from the first transistor T1.

The scan write signal GW may have a gate-on voltage during the third period t3 and may have a gate-off voltage during the other periods. The scan control signal GC may have the gate-on voltage during the first through third periods t1 through t3 and may have the gate-off voltage during the other periods. The first scan bias signal EB1 may have the gate-on voltage during the first, second, fifth, and sixth periods t1, t2, t5, and t6 and may have the gate-off voltage during the other periods. The second scan bias signal EB2 may have the gate-on voltage during the fourth and fifth periods t4 and t5 and may have the gate-off voltage during the other periods. The first emission signal EM1 may have the gate-on voltage during the second and seventh periods t2 and t7 and may have the gate-off voltage during the other periods. The second emission signal EM2 may have the gate-on voltage during the first, sixth, and seventh periods t1, t6, and t7 and may have the gate-off voltage during the other periods.

The gate-on voltage may correspond to a turn-on voltage that can turn on the second through eighth transistors T2 through T8. The gate-off voltage may be a turn-off voltage that can turn off the second through eighth transistors T2 through T8. The gate-on voltage may be lower than the gate-off voltage.

The operation of the subpixel SP during the first through seventh periods t1 through t7 will hereinafter be described with reference to FIGS. 3 and 4.

First, since during the first period t1, the second, fifth, and seventh transistors T2, T5, and T7 are turned on, the gate electrode of the first transistor T1 and the first electrode of the light-emitting element LE may be connected to the second driving voltage line VIL. As a result, the gate electrode of the first transistor T1 and the first electrode of the light-emitting element LE may be initialized to the second driving voltage VINT of the second driving voltage line VTL.

Also, since during the first period t1, the third transistor T3 is turned on, the first electrode of the first capacitor Cpr may be connected to the third driving voltage line VRL. As a result, the first electrode of the first capacitor Cpr may be initialized to the third driving voltage VREF from the third driving voltage line VRL.

Second, since during the second period t2, the fifth and sixth transistors T5 and T6 are turned on, the first transistor T1 may operate as a diode, and the fourth driving voltage VDD from the fourth driving voltage line VDL may be applied to the first electrode of the first transistor T1. Since the gate-source voltage Vgs of the first transistor T1 is lower than the threshold voltage of the first transistor T1, the first transistor T1 may form a current path until the gate-source voltage Vgs reaches the threshold voltage. As a result, during the second period t2, the threshold voltage of the first transistor T1 may be sampled to the gate electrode of the first transistor T1.

Also, since during the second period t2, the second transistor T2 is turned on, the second driving voltage VINT from the second driving voltage line VIL may be applied to the first electrode of the light-emitting element LE. Also, since during the second period t2, the third transistor T3 is turned on, the third driving voltage VREF from the third driving voltage line VRL may be applied to the first electrode of the first capacitor Cpr.

Third, since during the third period t3, the fourth transistor T4 is turned on, the first electrode of the first capacitor Cpr may be connected to the data line DL. As a result, the data voltage from the data line DL may be applied to the first electrode of the first capacitor Cpr.

Also, since during the third period t3, the fifth transistor T5 is turned on, the gate electrode and the second electrode of the first transistor T1 may be connected together. Thus, a voltage variation in the first electrode of the first capacitor Cpr may be reflected into the gate electrode of the first transistor T1. As a result, the data voltage may be applied (or sampled) to the gate electrode of the first transistor T1.

Fourth, since during the fourth period t4, the eighth transistor T8 is turned on, the gate-off voltage of the second emission signal EM2 from the second emission line EL2 may be applied to the second electrode of the first transistor T1. As a result, during the fourth period t4, a current corresponding to the voltage at the gate electrode of the first transistor T1 may flow between the first and second electrodes of the first transistor T1. That is, the on-bias voltage may be applied to the first transistor T1.

Fifth, since during the fifth period t5, the second and third transistors T2 and T3 are turned on, the first electrode of the light-emitting element LE may be initialized to the second driving voltage VINT from the second driving voltage line VIL, and the first electrode of the first capacitor Cpr may be initialized to the third driving voltage VREF from the third driving voltage line VRL. Also, since during the fifth period t5, the eighth transistor T8 is turned on, the on-bias voltage may be applied to the first transistor T1.

Sixth, since during the sixth period t6, the second and seventh transistors T2 and T7 are turned on, the second electrode of the first transistor T1 and the first electrode of the light-emitting element LE may be initialized to the second driving voltage VINT from the second driving voltage line VIL. Also, since during the sixth period t6, the third transistor T3 is turned on, the first electrode of the first capacitor Cpr may be initialized to the third driving voltage VREF from the third driving voltage line VRL.

Seventh, since during the seventh period t7, the sixth and seventh transistors T6 and T7 are turned on, the first electrode of the first transistor T1 may be connected to the fourth driving voltage line VDL, and the second electrode of the first transistor T1 may be connected to the light-emitting element LE. As a result, the driving current Ids, which flows in the first transistor T1 in accordance with the voltage at the gate electrode of the first transistor T1, may be provided to the light-emitting element EL.

Figure 5:
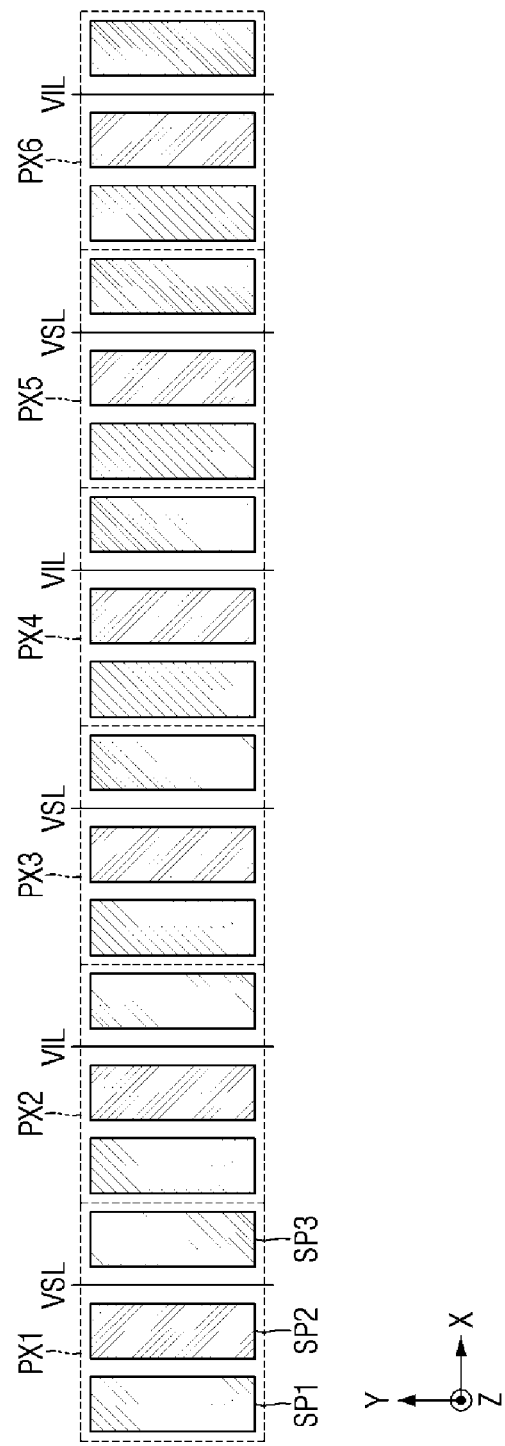
FIG. 5 is a layout view of pixels of a display panel according to an embodiment of the present disclosure.

FIG. 5 is a layout view of pixels of a display panel according to an embodiment of the present disclosure.

For convenience, FIG. 5 illustrates only first through sixth pixels PX1 through PX6, which are arranged in the first direction (or the X-axis direction) in the display panel 100.

Referring to FIG. 5, each of the first through sixth pixels PX1 through PX6 may include first, second, and third subpixels SP1, SP2, and SP3, which are arranged in the first direction (or the X-axis direction). The first, second, and third subpixels SP1, SP2, and SP3 may emit light of first, second, and third colors, respectively, and the first, second, and third colors may be red, green, and blue, respectively. However, the present disclosure according to the invention is not limited to this combination and sequence of colors. FIG. 5 illustrates that each of the first through sixth pixels PX1 through PX6 includes three subpixels, but the number of subpixels of each of the first through sixth pixels PX1 through PX6 is not particularly limited.

First driving voltage lines VSL and second driving voltage lines VIL may extend in the second direction (or the Y-axis direction). The first driving voltage lines VSL and the second driving voltage lines VIL may be alternately arranged in the first direction (or the X-axis direction). That is, the first driving voltage lines VSL and the second driving voltage lines VIL may be arranged in the order of a first driving voltage line VSL, a second driving voltage line VIL, a first driving voltage line VSL, and a second driving voltage line VIL in the first direction (or the X-axis direction).

One of the first driving voltage lines VSL or one of the second driving voltage lines VIL may be disposed in each pixel PX. For example, the first driving voltage lines VSL may be disposed in the first, third, and fifth pixels PX1, PX3, and PX5, and the second driving voltage lines VIL may be disposed in the second, fourth, and sixth pixels PX2, PX4, and PX6.

The locations of the first driving voltage lines VSL in the first, third, and fifth pixels PX1, PX3, and PX5 may be the same as the locations of the second driving voltage lines VIL in the second, fourth, and sixth pixels PX2, PX4, and PX6. That is, the first driving voltage lines VSL may be disposed between second and third subpixels SP2 and SP3 of the first pixel PX1, between second and third subpixels SP2 and SP3 of the third pixel PX3, and between second and third subpixels SP2 and SP3 of the fifth pixel PX5. The second driving voltage lines VIL may be disposed between second and third subpixels SP2 and SP3 of the second pixel PX2, between second and third subpixels SP2 and SP3 of the fourth pixel PX4, and between second and third subpixels SP2 and SP3 of the sixth pixel PX6.

By arranging one of the first driving voltage lines VSL or one of the second driving voltage lines VIL between second and third subpixels SP2 and SP3 of each pixel PX, as illustrated in FIG. 5, a first transistor T1 of the second subpixel SP2 can be effectively prevented or suppressed from being affected by a data line DL connected to the third subpixel SP3. This will hereinafter be described in detail with reference to FIGS. 6 and 7.

Figure 6:
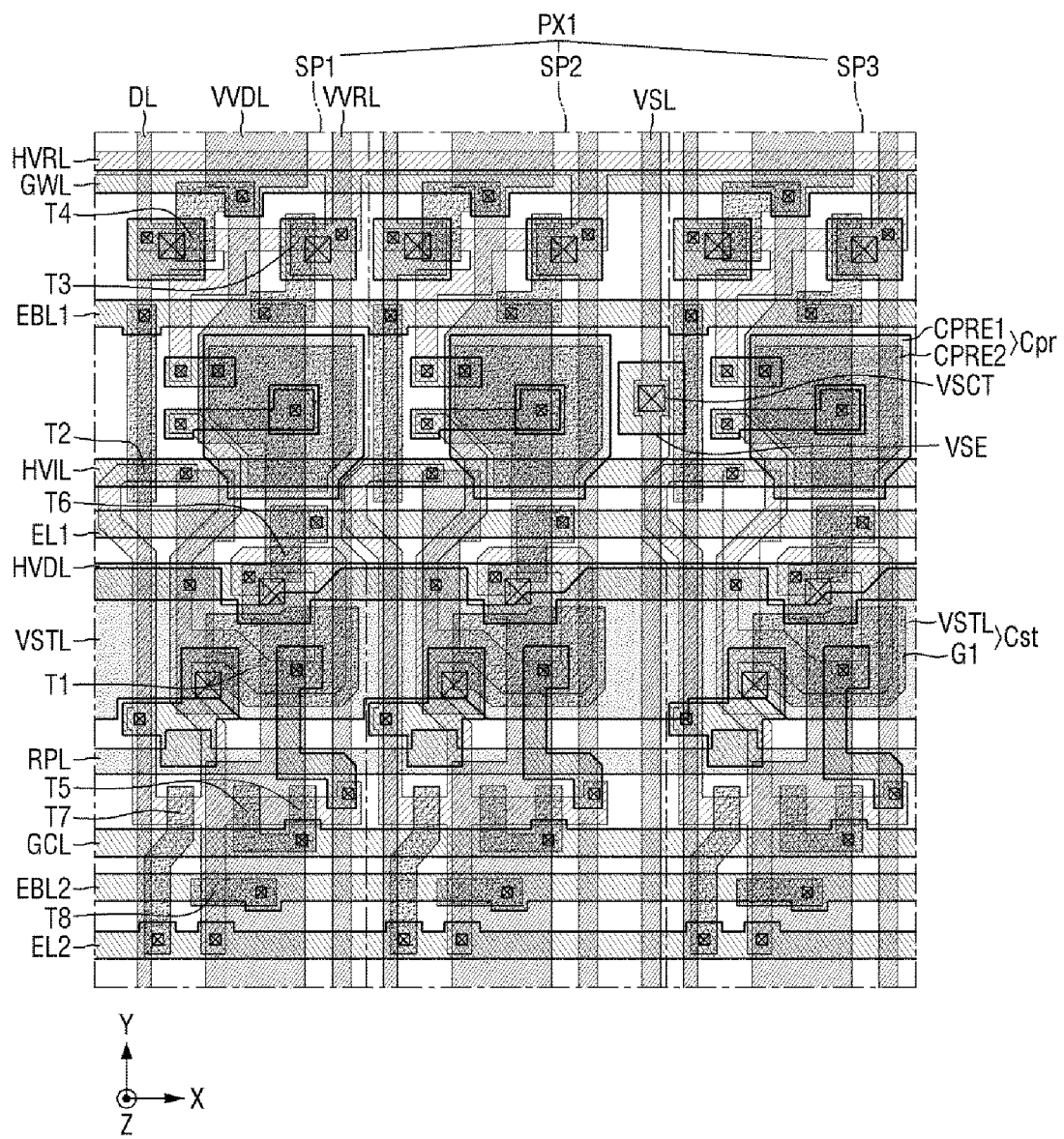
FIG. 6 is a layout view of a first pixel of FIG. 5.
Figure 7:
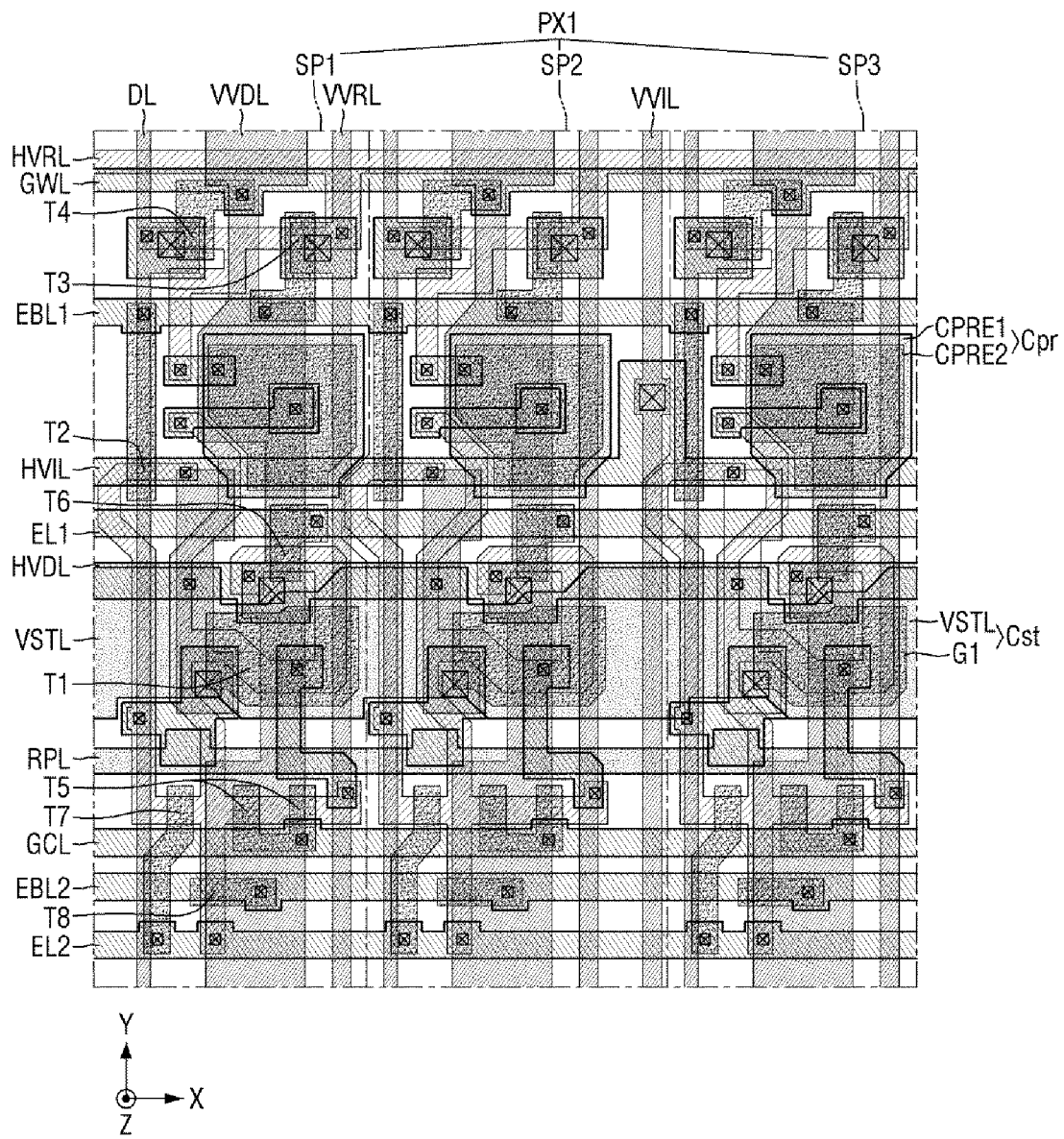
FIG. 7 is a layout view of a second pixel of FIG. 5.

FIG. 6 is a layout view of the first pixel of FIG. 5. FIG. 7 is a layout view of the second pixel of FIG. 5.

FIG. 6 illustrates the first, second, and third subpixels SP1, SP2, and SP3 of the first pixel PX1, and FIG. 7 illustrates the first, second, and third subpixels SP1, SP2, and SP3 of the second pixel PX2.

Referring to FIGS. 6 and 7, in each of the first and second pixels PX1 and PX2, first, second, and third subpixels SP1, SP2, and SP3 may be arranged in the first direction (or the X-axis direction). A second driving voltage line VIL may include a second horizontal driving voltage line HVIL which extends in the first direction (or the X-axis direction), and a second vertical driving voltage line VVIL which extends in the second direction (or the Y-axis direction). A third driving voltage line VRL may include a third horizontal driving voltage line HVRL which extends in the first direction (or the X-axis direction), and a third vertical driving voltage line VVRL which extends in the second direction (or the Y-axis direction). A fourth driving voltage line VDL may include a fourth horizontal driving voltage line HVDL which extends in the first direction (or the X-axis direction), a fourth vertical driving voltage line VVDL which extends in the second direction (or the Y-axis direction), and a storage voltage line VSTL which extends in the first direction (or the X-axis direction).

In each of the first, second, and third subpixels SP1, SP2, and SP3, the third horizontal driving voltage line HVRL, a scan write line GWL, a first scan bias line EBL1, the second horizontal driving voltage line HVIL, a first emission line EL1, the fourth horizontal driving voltage line HVDL, the storage voltage line VSTL, a repair line RL, a gate control line GCL, a second scan bias line EBL2, and a second emission line EL2 may extend in the first direction (or the X-axis direction) and may be arranged in the second direction (or the Y-axis direction). In each of the first, second, and third subpixels SP1, SP2, and SP3, a data line DL, the fourth vertical driving voltage line VVDL, and the third vertical driving voltage line VVRL may extend in the second direction (or the Y-axis direction) and may be arranged in the first direction (or the X-axis direction).

A first driving voltage line VSL may be disposed between the second and third subpixels SP2 and SP3 of the first pixel PX1. The second vertical driving voltage line VVIL of the second driving voltage line VIL may be disposed between the second and third subpixels SP2 and SP3 of the second pixel PX2.

Each of the first, second, and third subpixels SP1, SP2, and SP3 of each of the first and second pixels PX1 and PX2 may include first through eighth transistors T1 through T8, a first capacitor Cpr, and a second capacitor Cst.

The first transistor T1 may be disposed between two adjacent data lines DL in the first direction (or the X-axis direction). The first transistor T1 may be disposed between the fourth horizontal driving voltage line HVDL and the repair line RPL in the second direction (or the Y-axis direction). The first transistor T1 may overlap with the storage voltage line VSTL in a third direction (i.e., a Z-axis direction).

The second transistor T2 may be disposed between the first scan bias line EBL1 and the first emission line EL1 in the second direction (or the Y-axis direction). At least part of the second transistor T2 may overlap with the data line DL and the second horizontal driving voltage line VIL in the third direction (i.e., the Z-axis direction).

The third transistor T3 may be disposed between the fourth vertical driving voltage line VVDL and the third vertical driving voltage line VVRL in the first direction (or the X-axis direction). The third transistor T3 may be disposed between the scan write line GWL and the first scan bias line EBL1 in the second direction (or the Y-axis direction).

The fourth transistor T4 may be disposed between the data line DL and the fourth vertical driving voltage line VVDL in the first direction (or the X-axis direction). The fourth transistor T4 may be disposed between the scan write line GWL and the first scan bias line EBL1 in the second direction (or the Y-axis direction).

The fifth transistor T5 may be disposed between the repair line RL and the scan control line GCL in the second direction (or the Y-axis direction). At least part of the fifth transistor T5 may overlap with the fourth vertical driving voltage line VVDL4 in the third direction (i.e., the Z-axis direction).

The sixth transistor T6 may be disposed between the first emission line EL1 and the first transistor T1 in the second direction (or the Y-axis direction). At least part of the sixth transistor T6 may overlap with the fourth horizontal driving voltage line HVDL4 and the fourth vertical driving voltage line VVDL4 in the third direction (i.e., the Z-axis direction).

The seventh transistor T7 may be disposed between the data line DL and the fourth vertical driving voltage line VVDL in the first direction (or the X-axis direction). The seventh transistor T7 may be disposed between the repair line RPL and the scan control line GCL in the second direction (or the Y-axis direction).

The eighth transistor T8 may be disposed between the scan control line GCL and the second emission line EL2 in the second direction (or the Y-axis direction). The eighth transistor T8 may overlap with the second scan bias line EBL2 and the fourth vertical driving voltage line VVDL in the third direction (i.e., the Z-axis direction).

The first capacitor Cpr may include first and second capacitor electrodes CPRE1 and CPRE2, which overlap with the third direction (i.e., the Z-axis direction). That is, the first capacitor electrode CPRE1 may be the first electrode of the first capacitor Cpr, and the second capacitor electrode CPRE2 may be the second electrode of the first capacitor Cpr. The first capacitor Cpr may be disposed between the first emission line EL1 and the first scan bias line EBL1 in the second direction (or the Y-axis direction). The first capacitor Cpr may overlap with the second horizontal driving voltage line HVIL, the third vertical driving voltage line VVRL, and the fourth vertical driving voltage line VVDL in the third direction (i.e., the Z-axis direction).

The second capacitor Cst may include a gate electrode G1 of the first transistor T1 and part of the storage voltage line VSTL that overlaps with the gate electrode Gi of the first transistor T1 in the third direction (i.e., the Z-axis direction). That is, the gate electrode G1 of the first transistor T1 may be the first electrode of the second capacitor Cst, and the part of the storage voltage line VSTL may be the second electrode of the second capacitor Cst. The second capacitor Cst may be disposed between the two adjacent data lines DL in the first direction (or the X-axis direction). The second capacitor Cst may be disposed between the fourth horizontal driving voltage line HVDL and the repair line RPL in the second direction (or the Y-axis direction). The second capacitor Cst may overlap with the third vertical driving voltage line VVRL and the fourth vertical driving voltage line VVDL in the third direction (i.e., the Z-axis direction).

Figure 12:
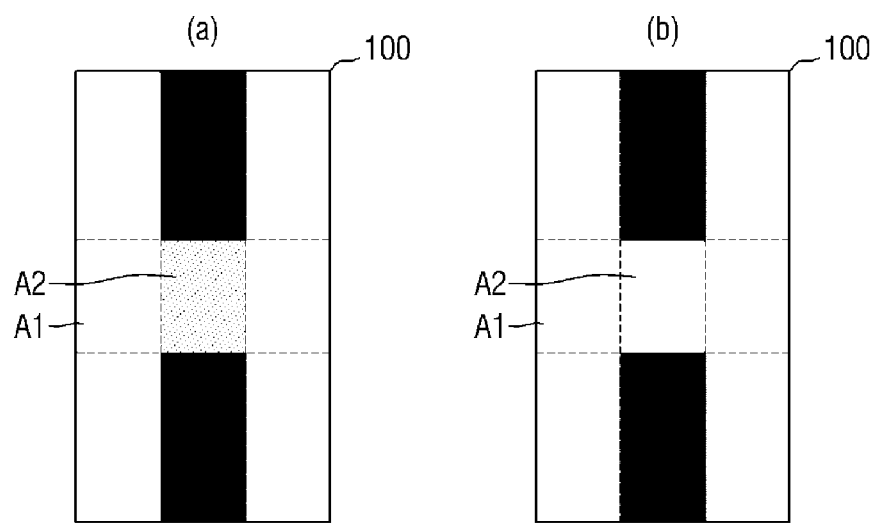
FIG. 12 illustrates variations in gradation between first and second areas of the display panel of FIG. 5 depending on the presence of first and second driving voltage lines of FIG. 5.

Referring to FIGS. 6 and 7, the first transistors T1 of the first, second, and third subpixels SP1, SP2, and SP3 may be affected by their respective neighboring data lines DL. For example, if a white-gradation data voltage is applied to gate electrodes G1 of the first transistors T1 of the first, second, and third subpixels SP1, SP2, and SP3 and a black-gradation data voltage is applied to the data lines DL, the voltage at the gate electrodes G1 of the first transistors T1 of the first, second, and third subpixels SP1, SP2, and SP3 may increase due to the presence of the data lines DL. As a result, the driving current Ids of the first transistors T1 of the first, second, and third subpixels SP1, SP2, and SP3 may become lower than it is supposed to be, and the emission luminance of the light-emitting elements LE of the first, second, and third subpixels SP1, SP2, and SP3 may also become lower than it is supposed to be. That is, the first, second, and third subpixels SP1, SP2, and SP3 may display a lower gradation than they are supposed to, in which case, the quality of display may be lowered, as illustrated in FIG. 12.

To prevent or suppress the first transistors T1 of the first, second, and third subpixels SP1, SP2, and SP3 from being affected by the data lines DL, first driving voltage lines VSL and third vertical driving lines VVIL of third driving voltage lines VIL may preferably be alternately arranged between every two adjacent subpixels SP. In this case, however, the integration density of subpixels SP may increase, and pixels per inch ("PPI") may increase accordingly. As a result, there may not be sufficient space in which to alternately arrange the first driving voltage lines VSL and the third vertical driving lines VVIL of the third driving voltage lines VIL between every two adjacent subpixels SP.

In a case where the first, second, and third subpixels SP1, SP2, and SP3 emit red light, green light, and blue light, respectively, the luminance of the corresponding pixel PX may be affected the most by a luminance variation in the second subpixel SP2 and least by a luminance variation in the third subpixel SP3. Thus, the variation of the luminance of the second subpixel SP2 needs to be minimized to minimize the variation of the luminance of the corresponding pixel PX.

In each of the first through sixth pixels PX1 through PX6, a first driving voltage line VSL or a third vertical driving voltage line VVIL of a third driving voltage line VIL may be disposed between the first transistor T1 of the second subpixel SP2 and the data line DL of the third subpixel SP3, which is the most adjacent data line DL to the first transistor T1 of the second subpixel SP2, to minimize the variation of the luminance of the second subpixel SP2. As a result, the first transistor T1 of the second subpixel SP2 can be effectively prevented or suppressed from being affected by the data line DL of the third subpixel SP3.

FIGS. 6 and 7 illustrate that a first driving voltage line VSL or a third vertical driving voltage line VVIL of a third driving voltage line VIL is disposed between the first transistor T1 of the second subpixel SP2 and the data line DL of the third subpixel SP3, but the present disclosure according to the invention is not limited thereto. That is, by arranging a first driving voltage line VSL or a third vertical driving voltage line VVIL of a third driving voltage line VIL between the first transistor T1 of the first subpixel SP1 and the data line DL of the second subpixel SP2, the first transistor T1 of the first subpixel SP1 can be prevented or suppressed from being affected by the data line DL of the second subpixel SP2. Also, by arranging a first driving voltage line VSL or a third vertical driving voltage line VVIL of a third driving voltage line VIL between the first transistor T1 of the third subpixel SP3 and the data line DL of the first subpixel SP1 of the next pixel, the first transistor T1 of the third subpixel SP3 can be effectively prevented or suppressed from being affected by the data line DL of the first subpixel SP1 of the next pixel.

Figure 8:
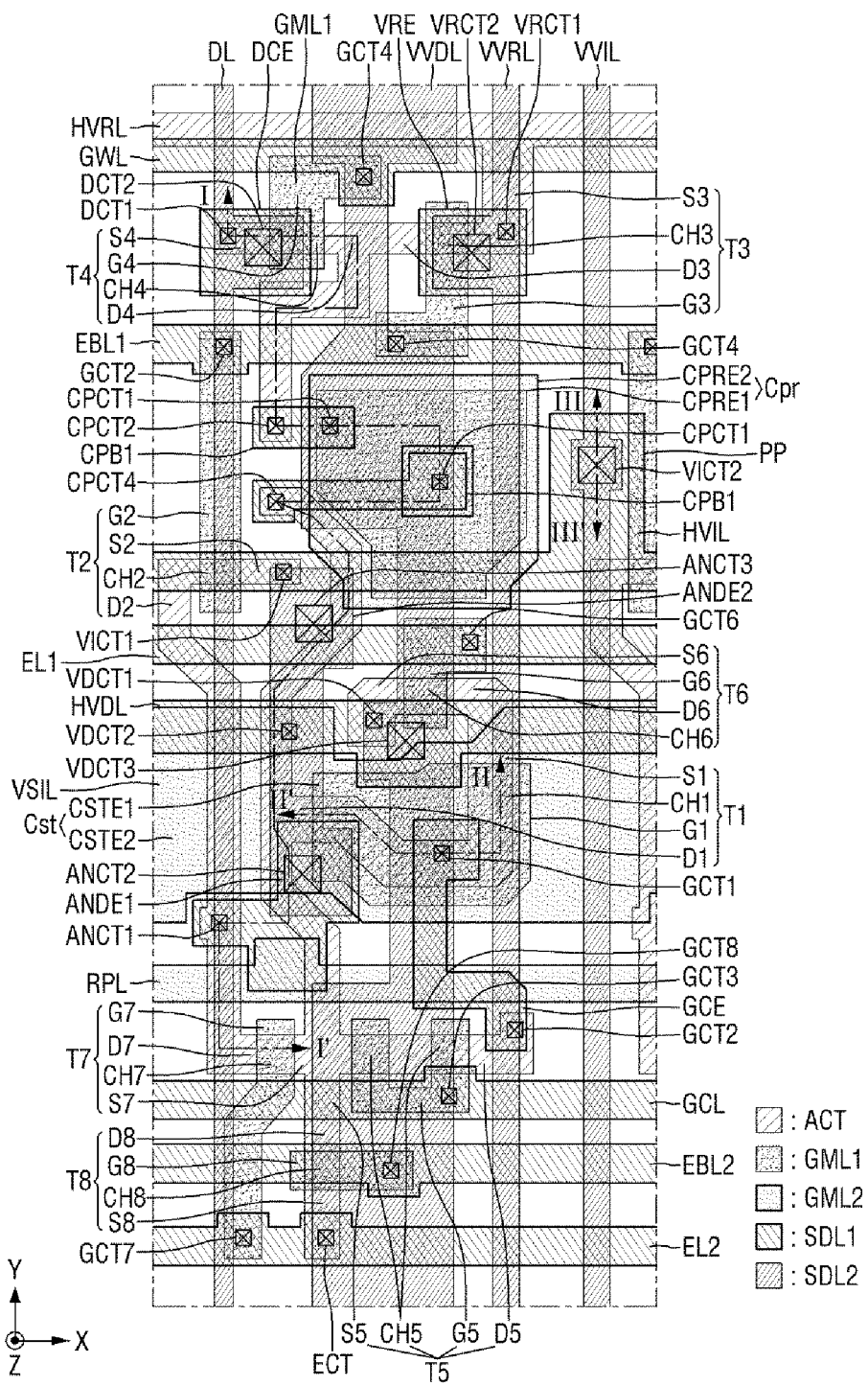
FIG. 8 is a detailed layout view of a second subpixel of the second pixel of FIG. 7.

FIG. 8 is a detailed layout view of the second subpixel of the second pixel of FIG. 7.

Referring to FIG. 8, an active layer ACT may include a third horizontal driving voltage line HVRL and channels CH1 through CH8, first electrodes S1 through S8, and second electrodes D1 through D8 of first through eighth transistors T1 through T8, which are arranged in the first direction (or the X-axis direction). The third horizontal driving voltage line HVRL, the channel CH3, the first electrode S3, and the second electrode D3 of the third transistor T3, and the channel CH4, the first electrode S4, and the second electrode D4 of the fourth transistor T4 may be connected to one another. The channels CH1, CH2, and CH5 through CH8, the first electrodes Si, S2, and S5 through S8, and the second electrodes D1, D2, and D5 through D8 of the first, second, and fifth through eighth transistors T1, T2, and T5 through T8 may be connected to one another.

The channels CH1 through CH8 of the first through eighth transistors T1 through T8 may be semiconductor regions, and the third horizontal driving voltage line HVRL and the first electrodes Si through S8 and the second electrodes D1 through D8 of the first through eighth transistors T1 through T8 may be conductive regions with conductivity.

A first gate metal layer GML1 may include gate electrodes G1 through G8 of the first through eighth transistors T1 through T8 and a second electrode CPRE2 of a first capacitor Cpr, which are arranged in the first direction (or the X-axis direction). The gate electrodes G1 through G8 of the first through eighth transistors T1 through T8 and the second electrode CPRE2 of the first capacitor Cpr may be formed as islands.

A second gate metal layer GML2 may include a storage voltage line VSTL, a repair line RPL, and a first electrode CPRE1 of a first capacitor Cpr. The second electrode CPRE2 of the first capacitor Cpr may be formed as an island.

A first source metal layer SDL1 may include a scan write line GWL, a first scan bias line EBL1, a second horizontal driving voltage line HVIL, a scan control line GCL, a second scan bias line EBL2, and a second emission line EL2, which are arranged in the first direction (or the X-axis direction). The first source metal layer SDL1 may further include a data connecting electrode DCE, a third driving connecting electrode VRE, a first capacitor connecting electrode CPB1, a second capacitor connecting electrode CPB2, a first anode connecting electrode ANDE1, and a gate connecting electrode GCE, which are formed as islands.

The gate connecting electrode GCE may be connected to the gate electrode G1 of the first transistor T1 through a first gate contact hole GCT1. The gate connecting electrode GCE may be connected to the second electrode D5 of the fifth transistor T5 through a ninth gate contact hole GCT9.

The first scan bias line EBL1 may be connected to the gate electrode G2 of the second transistor T2 through a second gate contact hole GCT2. The first scan bias line EBL1 may be connected to the gate electrode G3 of the third transistor T3 through a third gate contact hole GCT3.

The scan write line GWL may be connected to the gate electrode G4 of the fourth transistor T4 through a fourth gate contact hole GCT4. The scan control line GCL may be connected to the gate electrode G5 of the fifth transistor T5 through a fifth gate contact hole GCT5.

The first emission line EL1 may be connected to the gate electrode G6 of the sixth transistor T6 through a sixth gate contact hole GCT6. The second emission line EL2 may be connected to the gate electrode G7 of the seventh transistor T7 through a seventh gate contact hole GCT7. The second scan bias line EBL2 may be connected to the gate electrode G8 of the eighth transistor T8 through an eighth gate contact hole GCT8.

The second horizontal driving voltage line HVIL may be connected to the first electrode S2 of the second transistor T2 through a first initialization contact hole VICT. The third driving connecting electrode VRE may be connected to the first electrode S3 of the third transistor T3 through a first reference contact hole VRCT1. The data connecting electrode DCE may be connected to the first electrode S4 of the fourth transistor T4 through a first data contact hole DCT1.

A fourth horizontal driving voltage line HVDL may be connected to the first electrode S6 of the sixth transistor T6 through a first high-potential contact hole VDCT1. The fourth horizontal driving voltage line HVDL may be connected to the storage voltage line VSTL through a second high-potential contact hole VDCT2.

The second emission line EL2 may be connected to the first electrode S8 of the eighth transistor T8 through an emission contact hole ECT. The first anode connecting electrode ANDE1 may be connected to the second electrode D7 of the seventh transistor T7 through a first anode contact hole ANCT1.

The first capacitor connecting electrode CPB1 may be connected to the second electrodes D3 and D4 of the third and fourth transistors T3 and T4 through a first capacitor contact hole CPCT1. The first capacitor connecting electrode CPB1 may be connected to the first electrode CPRE1 of the first capacitor Cpr through a second capacitor contact hole CPCT2.

The second capacitor connecting electrode CPB2 may be connected to the second electrode CPRE2 of the first capacitor Cpr through a third capacitor contact hole CPCT3. The second capacitor connecting electrode CPB2 may be connected to the second electrode D1 of the first transistor T1 through a fourth capacitor contact hole CPCT4.

A second source metal layer SDL2 may include a data line DL, a fourth vertical driving voltage line VVDL, a third vertical driving voltage line VVRL, a second vertical driving voltage line VVIL, and a first driving voltage line VSL (of FIGS. 6 and 7), which are arranged in the second direction (or the Y-axis direction). The second source metal layer SDL2 may further include a second anode connecting electrode ANDE2, which is formed as an island.

The data line DL may be connected to the data connecting electrode DCE through a second data contact hole DCT2. The size of the second data contact hole DCT2 may be greater than the size of the first data contact hole DCT1.

The third vertical driving voltage line VVRL may be connected to the third driving connecting electrode VRE through a second reference contact hole VRCT2. The size of the second reference contact hole VRCT2 may be greater than the size of the first reference contact hole VRCT1.

The fourth vertical driving voltage line VVDL may be connected to the fourth horizontal driving voltage line HVDL through a third high-potential contact hole VDCT3. The size of the third high-potential contact hole VDCT3 may be greater than each of the sizes of the first and second high-potential contact holes VDCT1 and VDCT2.

The second vertical driving voltage line VVIL may be connected to the second horizontal driving voltage line HVIL through a second initialization contact hole VICT2. The second horizontal driving voltage line HVIL may include a protruding part PP that protrudes in the second direction (or the Y-axis direction) in an area where the second horizontal driving voltage line HVIL overlaps with the second vertical driving voltage line VVIL, as illustrated in FIG. 8, and the second vertical driving voltage line VVIL may be connected to the protruding part PP.

The first driving voltage line VSL may be connected to a first driving connecting electrode VSE through a first driving contact hole VSCT, as illustrated in FIGS. 6 and 7. The first driving connecting electrode VSE may be formed as an island.

Since the second vertical driving voltage line VVIL is disposed between the gate electrode G1 of the first transistor T1 of the second subpixel SP2 and the data line DL of the third subpixel SP3, as illustrated in FIG. 8, the gate electrode G1 of the first transistor T1 of the second subpixel SP2 can be effectively prevented or suppressed from being affected by the data line DL of the third subpixel SP3.

Also, the second vertical driving voltage line VVIL is disposed between the gate connecting electrode GCE, which is connected to the gate electrode G1 of the first transistor T1 of the second subpixel SP2, and the data line DL of the third subpixel SP3. As a result, the gate connecting electrode GCE of the second subpixel SP2 can be prevented or suppressed from being affected by the data line DL of the third subpixel SP3. Accordingly, the gate electrode G1 of the first transistor T1 of the second subpixel SP2 can be further prevented or suppressed from being affected by the data line DL of the third subpixel SP3.

Also, the second vertical driving voltage line VVIL is disposed between the second electrode D5 of the fifth transistor T5, which is connected to the gate electrode G1 of the first transistor T1 via the gate connecting electrode GCE, and the data line DL of the third subpixel SP3. As a result, the second electrode D5 of the fifth transistor T5 of the second subpixel SP2 can be effectively prevented or suppressed from being affected by the data line DL of the third subpixel SP3. Accordingly, the gate electrode G1 of the first transistor T1 of the second subpixel SP2 can be further prevented or suppressed from being affected by the data line DL of the third subpixel SP3.

Figure 9:
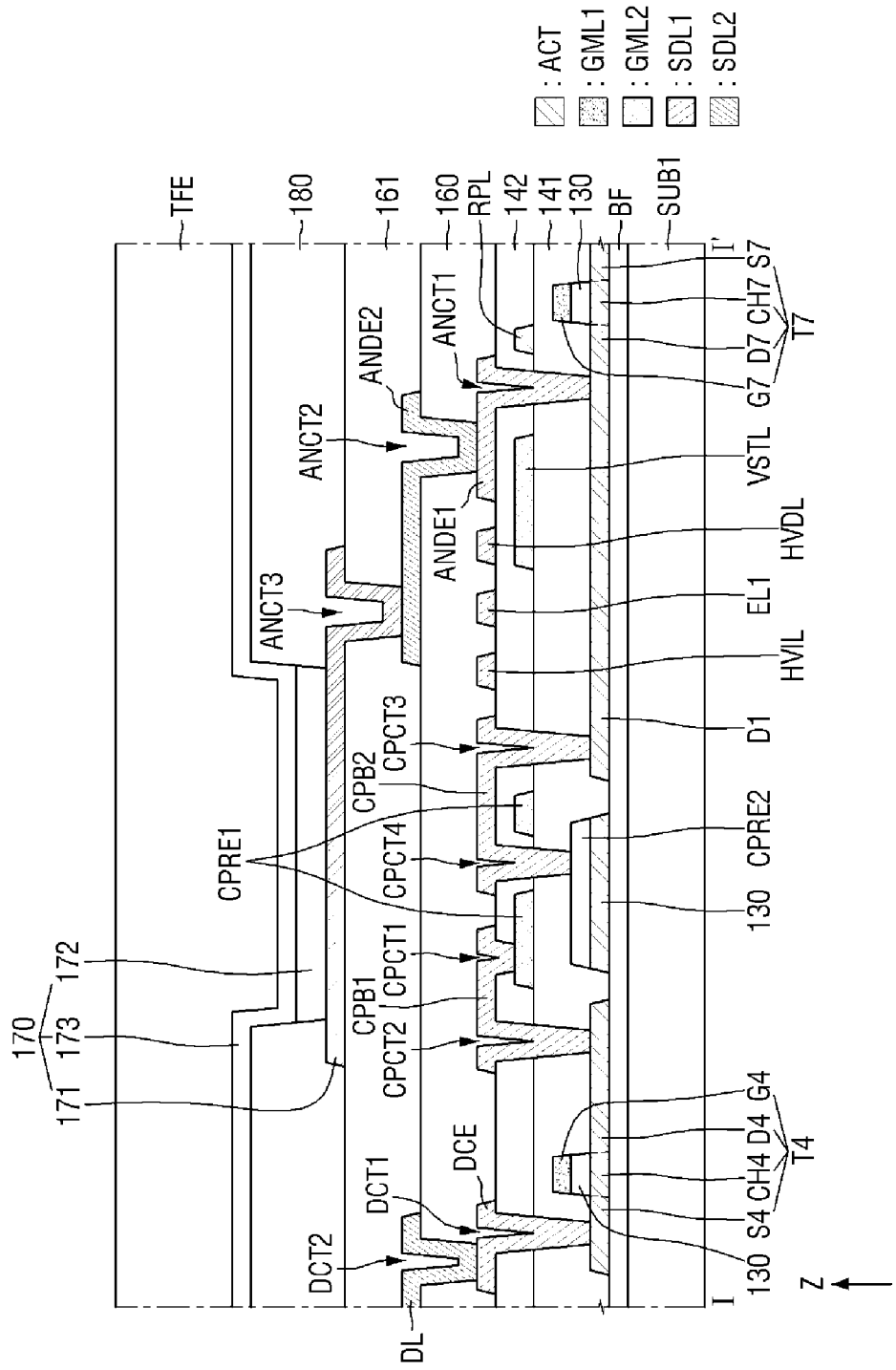
FIG. 9 is a cross-sectional view, taken along line I-I' of FIG. 8, of the display panel of FIG. 5.
Figure 10:
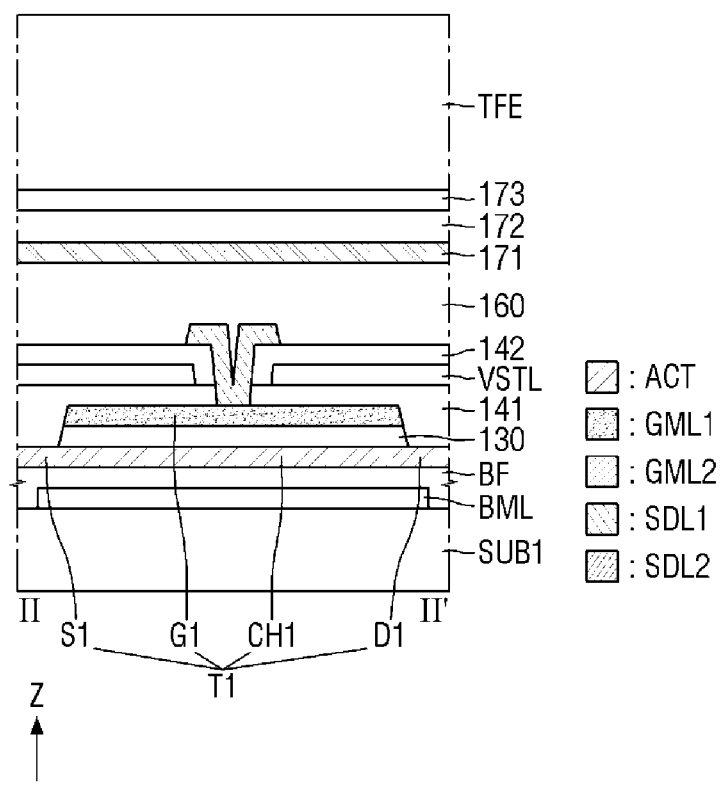
FIG. 10 is a cross-sectional view, taken along line II-II' of FIG. 8, of the display panel of FIG. 5.
Figure 11:
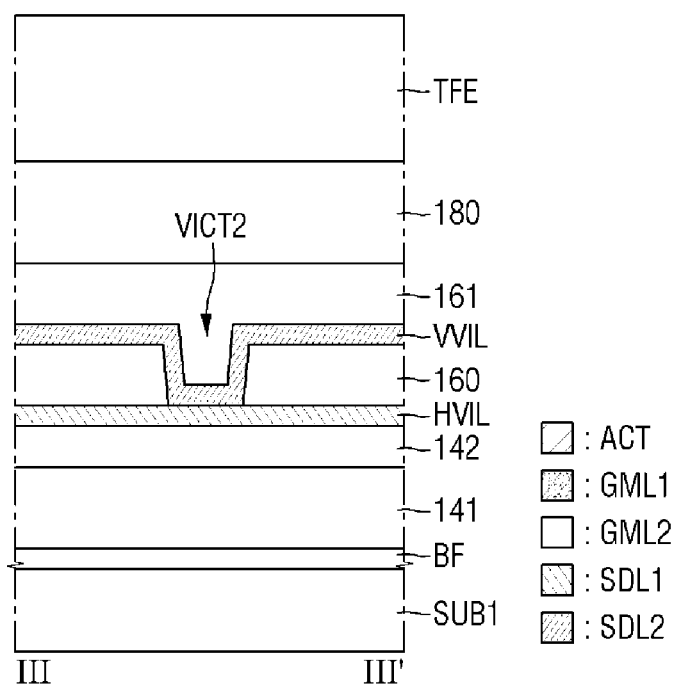
FIG. 11 is a cross-sectional view, taken along line III-III' of FIG. 8, of the display panel of FIG. 5.

FIG. 9 is a cross-sectional view, taken along line I-I' of FIG. 8, of the display panel of FIG. 5. FIG. 10 is a cross-sectional view, taken along line II-II' of FIG. 8, of the display panel of FIG. 5. FIG. 11 is a cross-sectional view, taken along line III-III' of FIG. 8, of the display panel of FIG. 5.

For convenience, FIGS. 9 through 11 illustrate only the fourth transistor T4, the first capacitor Cpr, the first and second anode connecting electrodes ANDE1 and ANDE2, the seventh transistor T7, the first transistor T1, the second horizontal driving voltage line HVIL, and the second vertical driving voltage line VVIL of FIG. 8.

Referring to FIGS. 9 through 11, a TFT layer TFTL, a light-emitting element layer EML, and an encapsulation layer TFE may be sequentially disposed on a substrate SUB1.

The TFT layer TFTL includes a light-blocking layer, a buffer film BF, the active layer ACT, the first gate metal layer GML1, the second gate metal layer GML2, the first source metal layer SDL1, the second source metal layer SDL2, a gate insulating film 130, a first interlayer insulating film 141, a second interlayer insulating film 142, a passivation film 150, a first organic film 160, and a second organic film 161.

The light-blocking layer BML may be disposed on one surface of the substrate SUB1. The light-blocking layer BML may overlap with the channel CH1 of the first transistor T1 in the third direction (i.e., the Z-axis direction) to block light incident upon the channel CH1 of the first transistor T1, but the present disclosure according to the invention is not limited thereto. Alternatively, the light-blocking layer BML may overlap not only with the channel CH1 of the first transistor T1, but also with at least one of the channels CH2 through CH8 of the second through eighth transistors T2 through T8, to block not only light incident upon the channel CH1 of the first transistor T1, but also light incident upon at least one of the channels CH2 through CH8 of the second through eighth transistors T2 through T8. The third direction (i.e., the Z-axis direction) may be the thickness direction of the substrate SUB1 or the display panel 100. The light-blocking layer BML may be a single- or multilayer film including molybdenum (Mo), aluminum (Al), chromium (Cr), gold (Au), titanium (T1), nickel (Ni), neodymium (Nd), copper (Cu), or an alloy thereof. The light-blocking layer BML may not be provided.

The buffer film BF may be disposed on the light-blocking layer BML. The buffer film BF may be disposed on the surface of the substrate SUB1 to protect TFTs and an organic light-emitting layer 172 of the light-emitting element layer EML from moisture that may penetrate the substrate SUB1, which is susceptible to moisture. The buffer film BF may consist of a plurality of inorganic films that are alternately stacked. For example, the buffer film BF may be formed as a multilayer film in which one or more inorganic films such as a silicon nitride layer, a silicon oxynitride layer, a silicon oxide layer, a titanium oxide layer, and an aluminum oxide layer are alternately stacked.

The active layer ACT may be disposed on the buffer film BF. The active layer ACT may include polycrystalline silicon, monocrystalline silicon, low-temperature polycrystalline silicon, amorphous silicon, or an oxide semiconductor. In a case where the active layer ACT includes or is formed of polycrystalline silicon or an oxide semiconductor, the active layer ACT, which is doped with ions, may have conductivity.

The gate insulating film 130 may be disposed on the active layer ACT. The gate insulating film 130 may be disposed on the channels CH1 through CH8 of the first through eighth transistors T1 through T8. The gate insulating film 130 may be an inorganic layer such as, for example, a silicon nitride layer, a silicon oxynitride layer, a silicon oxide layer, a titanium oxide layer, or an aluminum oxide layer.

The first gate metal layer GML1 may be disposed on the gate insulating film 130. The first gate metal layer GML1 may be a single- or multilayer film including Mo, Al, Cr, Au, T1, Ni, Nd, Cu, or an alloy thereof.

The first interlayer insulating film 141 may be disposed on the first gate metal layer GML1 and on parts of the active layer ACT. The first interlayer insulating film 141 may be an inorganic film such as, for example, a silicon nitride layer, a silicon oxynitride layer, a silicon oxide layer, a titanium oxide layer, or an aluminum oxide layer. The first interlayer insulating film 141 may include a plurality of inorganic films.

The second gate metal layer GML2 may be disposed on the first interlayer insulating film 141. The second gate metal layer GML2 may be a single- or multilayer film including Mo, Al, Cr, Au, T1, Ni, Nd, Cu, or an alloy thereof.

The second interlayer insulating film 142 may be disposed on the second gate metal layer GML2. The second interlayer insulating film 142 may be an inorganic film such as, for example, a silicon nitride layer, a silicon oxynitride layer, a silicon oxide layer, a titanium oxide layer, or an aluminum oxide layer. The second interlayer insulating film 142 may include a plurality of inorganic films.

The first source metal layer SDL1 may be disposed on the second interlayer insulating film 142. The first source metal layer SDL1 may be a single- or multilayer film including Mo, Al, Cr, Au, T1, Ni, Nd, Cu, or an alloy thereof.

The first organic film 160 may be disposed on the first source metal layer SDL1 to planarize the first source metal layer SDL1 for height differences generated by the active layer ACT, the first gate metal layer GML1, the second gate metal layer GML2, and the first source metal layer SDL1. The first organic film 160 may be an organic film including an acrylic resin, an epoxy resin, a phenolic resin, a polyamide resin, or a polyimide resin.

The second source metal layer SDL2 may be disposed on the first organic film 160. The second source metal layer SDL2 may be a single- or multilayer film including Mo, Al, Cr, Au, T1, Ni, Nd, Cu, or an alloy thereof.

The second organic film 161 may be disposed on the second source metal layer SDL2 to planarize the second source metal layer SDL2 for any height differences. The second organic film 161 may be an organic film including an acrylic resin, an epoxy resin, a phenolic resin, a polyamide resin, or a polyimide resin.

The first through eighth transistors T1 through T8 are illustrated in FIGS. 9 and 10 as being top-gate TFTs where the gate electrodes G1 through G8 are disposed above the active layer ACT, but the present disclosure according to the invention is not limited thereto. Alternatively, the first through eighth transistors T1 through T8 may be bottom-gate TFTs in which the gate electrodes G1 through G8 are disposed below the active layer ACT or double-gate TFTs in which the gate electrodes G1 through G8 are disposed both above and below the active layer ACT.

The first data contact hole DCT1 may be a hole that exposes the first electrode S4 of the fourth transistor T4 out of the first and second interlayer insulating films 141 and 142. The data connecting electrode DCE may be connected to the first electrode S4 of the fourth transistor T4 through the first data contact hole DCT1.

The second data contact hole DCT2 may be a hole that exposes the data connecting electrode DCE out of the first organic film 160. The data line DL may be connected to the data connecting electrode DCE through the second data contact hole DCT2.

The first capacitor contact hole CPCT1 may be a hole that exposes the first electrode CPRE1 of the first capacitor Cpr out of the second interlayer insulating film 142. The first capacitor connecting electrode CPB1 may be connected to the first electrode CPRE1 of the first capacitor Cpr through the first capacitor contact hole CPCT1.

The second capacitor contact hole CPCT2 may be a hole that exposes the second electrode D4 of the fourth transistor T4 out of the first and second interlayer insulating films 141 and 142. The first capacitor connecting electrode CPB1 may be connected to the second electrode D4 of the fourth transistor T4 through the second capacitor contact hole CPCT2.

The third capacitor contact hole CPCT3 may be a hole that exposes the second electrode CPRE2 of the first capacitor Cpr out of the first and second interlayer insulating films 141 and 142. The second capacitor connecting electrode CPB2 may be connected to the second electrode CPRE2 of the first capacitor Cpr through the third capacitor contact hole CPCT3.

The fourth capacitor contact hole CPCT4 may be a hole that exposes the second electrode D1 of the first transistor T1 out of the first and second interlayer insulating films 141 and 142. The second capacitor connecting electrode CPB2 may be connected to the second electrode D1 of the first transistor T1 through the fourth capacitor contact hole CPCT4.

The first anode contact hole ANCT1 may be a hole that exposes the second electrode D7 of the seventh transistor T7 out of the first and second interlayer insulating films 141 and 142. The first anode contact hole ANDE1 may be connected to the second electrode D7 of the seventh transistor T7 through the first anode contact hole ANCT1.

The second anode contact hole ANCT2 may be a hole that exposes the first anode connecting electrode ANDE1 out of the first organic film 160. The second anode connecting electrode ANDE2 may be connected to the first anode connecting electrode ANDE1 through the second anode contact hole ANCT2.

The second initialization contact hole VICT2 may be a hole that exposes the second horizontal driving voltage line HVIL out of the first organic film 160. The second vertical driving voltage line VVIL may be connected to the second horizontal driving voltage line HVIL through the second initialization contact hole VICT2.

The first driving contact hole VSCT of FIG. 7 may be a hole that exposes the first driving connecting electrode VSE out of the first organic film 160. The first driving voltage line VSL may be connected to the first driving connecting electrode VSE through the first driving contact hole VSCT.

The light-emitting element layer EML is disposed on the TFT layer TFTL. The light-emitting element layer EML includes a light-emitting element 170 and a bank 180.

The light-emitting element 170 and the bank 180 are disposed on the first organic film 160. The light-emitting element 170 may include a first electrode 171, an organic light-emitting layer 172, and a second electrode 173.

The first electrode 171 may be disposed on the second organic film 161. The first electrode 171 may be connected to the second anode connecting electrode ANDE2 through the third anode contact hole ANCT3. The third anode contact hole ANCT3 may be a hole that exposes the second anode connecting electrode ANDE2 out of the second organic film 161.

In a top-emission structure that emits light in a direction from the organic light-emitting layer 172 to the second electrode 173, the first electrode 171 may include or be formed of a metallic material with high reflectance such as a stack of Al and Ti (e.g., Ti/Al/Ti), a stack of Al and indium tin oxide ("ITO") (e.g., ITO/Al/ITO), a silver (Ag)-palladium (Pd)-copper (Cu) ("APC") alloy, or a stack of an APC alloy and ITO (e.g., ITO/APC/ITO).

The bank 180 may be disposed on the second organic film 161 to define the first electrode 171 and thus to define an emission area EA2 of the second subpixel SP2. The bank 180 may cover edges of the first electrode 171. The bank 180 may be an organic film including an acrylic resin, an epoxy resin, a phenolic resin, a polyamide resin, or a polyimide resin.

The emission area EA2 of the second subpixel SP2 may refer to a region where the first electrode 171, the organic light-emitting layer 172, and the second electrode 173 are sequentially stacked so that holes from the first electrode 171 and electrons from the second electrode 173 combine together in the organic light-emitting layer 172 to emit light.

The organic light-emitting layer 172 is disposed on the first electrode 171 and the bank 180. The organic light-emitting layer 172 may include an organic material and may thus emit light of a particular color. For example, the organic light-emitting layer 172 may include a hole transport layer, an organic material layer, and an electron transport layer.

An organic light-emitting layer 172 of the first subpixel SP1 may emit light of the first color, the organic light-emitting layer 172 of the second subpixel SP2 may emit light of the second color, and an organic light-emitting layer 172 of the third subpixel SP3 may emit light of the third color. Alternatively, the organic light-emitting layer 172 may be formed in common (i.e., monolithic) for all the first, second, and third subpixels SP1, SP2, and SP3 and may emit white light, in which case, the first, second, and third subpixels SP1, SP2, and SP3 may overlap with first-, second-, and third-color filter layers, respectively.

The second electrode 173 may be disposed on the organic light-emitting layer 172. The second electrode 173 may cover the organic light-emitting layer 172. The second electrode 173 may be a common layer formed in common (i.e., monolithic) for all the first, second, and third subpixels SP1, SP2, and SP3. A capping layer may be disposed on the second electrode 173.

In the top-emission structure, the second electrode 173 may include or be formed of a transparent metallic material such as ITO or indium zinc oxide ("IZO") or a semitransparent metallic material such as magnesium (Mg), Ag, or an alloy thereof. In a case where the second electrode 173 includes or is formed of a semitransparent metallic material, the emission efficiency of the second electrode 173 can be improved due to micro-cavities.

The encapsulation layer TFE may be disposed on the light-emitting element layer EML. The encapsulation layer TFE may include at least one inorganic film to effectively prevent the penetration of oxygen or moisture into the light-emitting element layer EML. The encapsulation layer TFE may further include at least one organic film to protect the light-emitting element layer EML from foreign materials such as dust.

Alternatively, a substrate, instead of the encapsulation layer TFE, may be disposed on the light-emitting element layer EML, and the space between the light-emitting element layer EML and the substrate may be empty in a vacuum or may have a filling film disposed therein. The filling film may be an epoxy filling film or a silicone filling film.

FIG. 12 illustrates variations in gradation between first and second areas of the display panel of FIG. 5 depending on the presence of first and second driving voltage lines of FIG. 5.

Referring to FIG. 12, in a case where the upper and lower middle areas of the display panel 100 display a black (B) image and the other areas of the display panel 100 display a white (W) image, a first area A1, which is the left middle area of the display panel 100, and a second area A2, which is the central area of the display panel 100, are supposed to display the same W image. However, since the upper and lower middle areas of the display panel 100 both display the B image, gate electrodes G1 of first transistors T1 of second subpixels SP2 in the second area A2 may be affected by a black-gradation data voltage applied to data lines DL of third subpixels SP3 adjacent to the second subpixels SP2. Thus, the voltage applied to the gate electrodes G1 of the first transistors T1 of the second subpixels SP2 in the second area A2 may increase and may thus become higher than the voltage applied to gate electrodes G1 of first transistors T1 of second subpixels SP2 in the first area A1. In this case, the W image displayed in the second area A2 may become slightly darker than the W image displayed in the first area A1, as illustrated in (a) of FIG. 12.

As described above with reference to FIGS. 5 through 11, a first driving voltage line VSL or a third vertical driving voltage line VVIL of a third driving voltage line VIL is disposed between second and third subpixels SP2 and SP3 of each pixel PX, particularly, between a first transistor T1 of the second subpixel SP2 and a data line DL of the third subpixel SP3. As a result, the first transistor T1 of the second subpixel SP2 can be effectively prevented or suppressed from being affected by the data line DL of the third subpixel SP3. In this case, the W image displayed in the second area A2 and the W image displayed in the first area A1 may become almost identical, as illustrated in (b) of FIG. 12. That is, any difference between the W image displayed in the second area A2 and the W image displayed in the first area A1 can be prevented or reduced.

Figure 13:
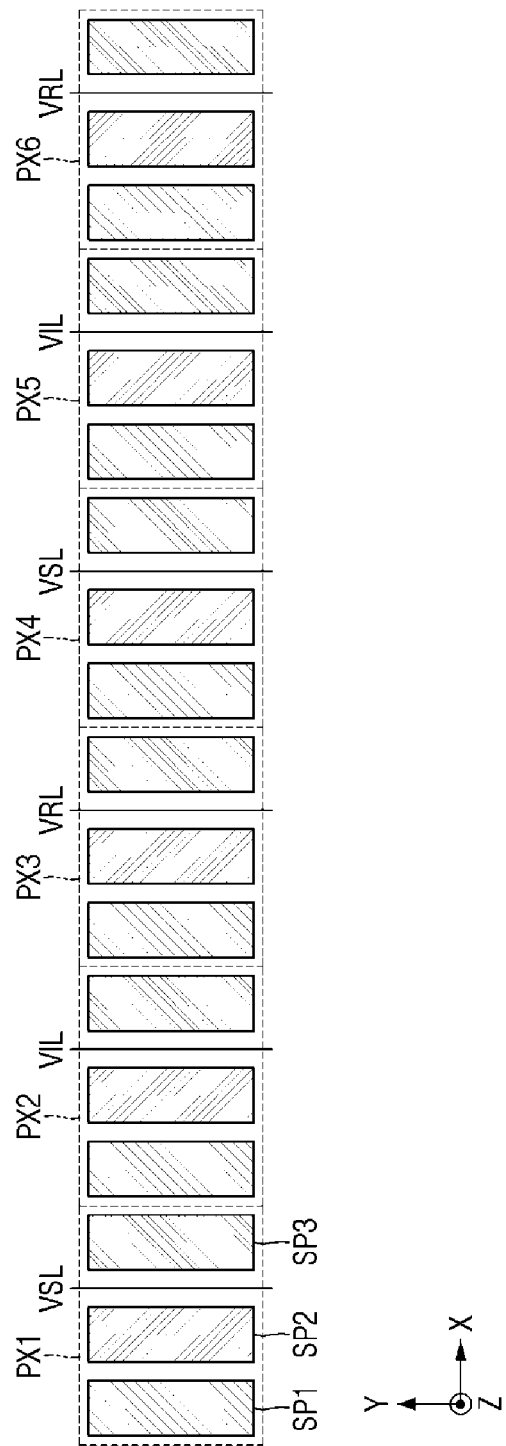
FIG. 13 is a layout view of pixels of a display panel according to another embodiment of the present disclosure.

FIG. 13 is a layout view of pixels of a display panel according to another embodiment of the present disclosure.

The embodiment of FIG. 13 differs from the embodiment of FIG. 5 in that a third driving voltage line VRL is disposed between second and third subpixels SP2 and SP3 of a third pixel PX3.

Referring to FIG. 13, first driving voltage lines VSL, second driving voltage lines VIL, and third driving voltage lines VRL may be alternately arranged in the first direction (or the X-axis direction). For example, the first driving voltage lines VSL, the second driving voltage lines VIL, and the third driving voltage lines VRL may be arranged in the order of a first driving voltage line VSL, a second driving voltage line VIL, a third driving voltage line VRL, a first driving voltage line VSL, a second driving voltage line VIL, and a third driving voltage line VRL in the first direction (or the X-axis direction), but the present disclosure according to the invention is not limited thereto. Alternatively, the first driving voltage lines VSL, the second driving voltage lines VIL, and the third driving voltage lines VRL may be arranged in the order of a second driving voltage line VIL, a first driving voltage line VSL, and a third driving voltage line VRL in the first direction (or the X-axis direction).

One of the first driving voltage lines VSL, one of the second driving voltage lines VIL, or one of the third driving voltage lines VRL may be disposed in each pixel PX. For example, the first driving voltage lines VSL may be disposed in first and fourth pixels PX1 and PX4, the second driving voltage lines VIL may be disposed in second and fifth pixels PX2 and PX5, and the third driving voltage lines VRL may be disposed in third and sixth pixels PX3 and PX6.

The locations of the first driving voltage lines VSL in the first and fourth pixels PX1 and PX4 may be the same as the locations of the second driving voltage lines VIL in the second and fifth pixels PX2 and PX5. Also, the locations of the first driving voltage lines VSL in the first and fourth pixels PX1 and PX4 may be the same as the locations of the third driving voltage lines VRL in the third and sixth pixels PX3 and PX6. For example, the first driving voltage lines VSL may be disposed between second and third subpixels SP2 and SP3 of the first pixel PX1 and between second and third subpixels SP2 and SP3 of the fourth pixel PX4, the second driving voltage lines VIL may be disposed between second and third subpixels SP2 and SP3 of the second pixel PX2 and between second and third subpixels SP2 and SP3 of the fifth pixel PX5, and the third driving voltage lines VRL may be disposed between second and third subpixels SP2 and SP3 of the third pixel PX3 and between second and third subpixels SP2 and SP3 of the sixth pixel PX6.

By arranging one of the first driving voltage lines VSL, one of the second driving voltage lines VIL, or one of the third driving voltage lines VRL between second and third subpixels SP2 and SP3 of each pixel PX, as illustrated in FIG. 13, a first transistor T1 of the second subpixel SP2 can be effectively prevented or suppressed from being affected by a neighboring data line DL connected to the third subpixel SP3.

Figure 14:
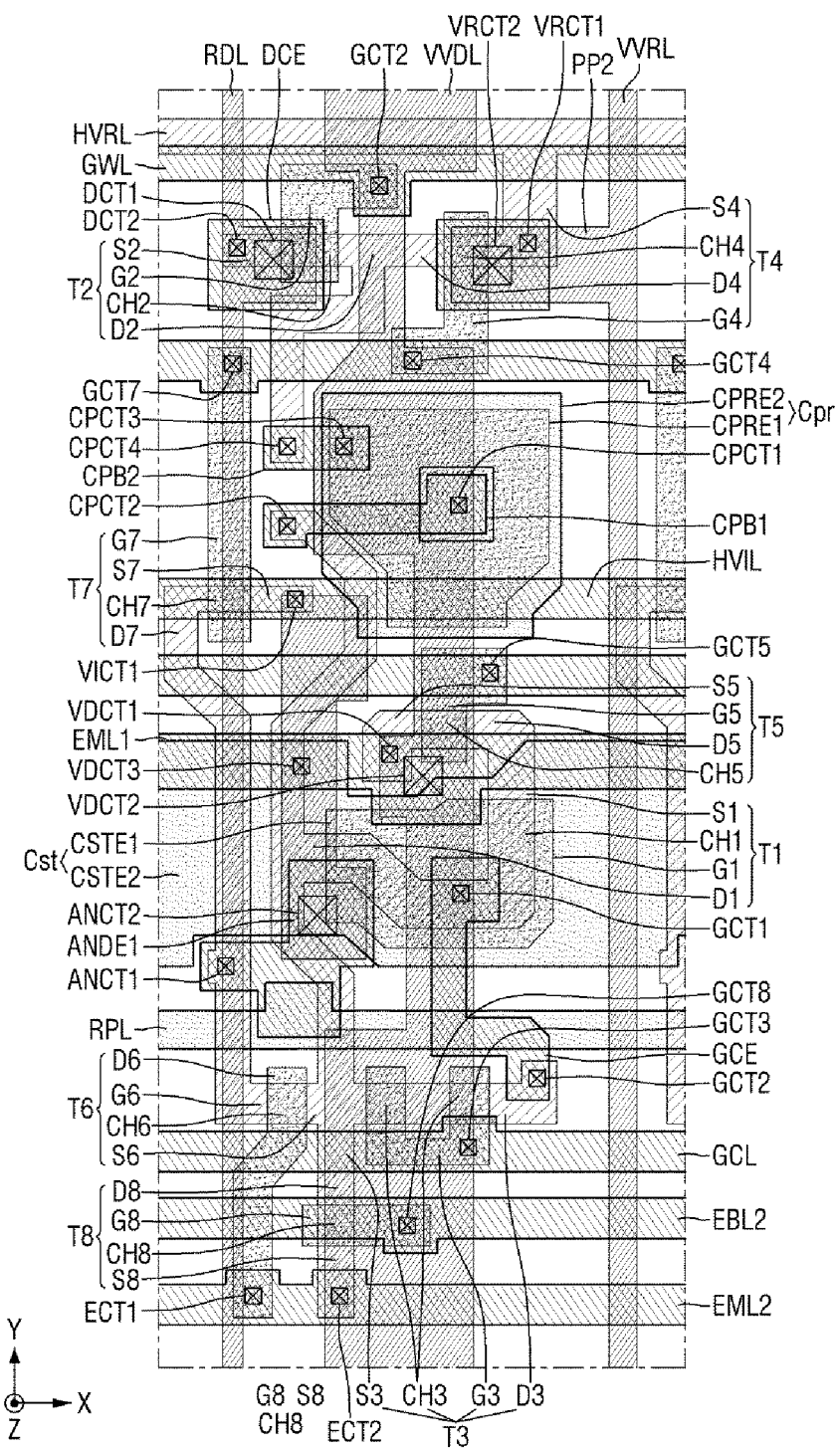
FIG. 14 is a layout view of a second subpixel of a third pixel of FIG. 13.

FIG. 14 is a layout view of a second subpixel of the third pixel of FIG. 13.

The embodiment of FIG. 14 differs from the embodiment of FIG. 8 only in that a third vertical driving voltage line VVRL is disposed between second and third subpixels SP2 and SP3 of the third pixel PX3 and thus will hereinafter be described, focusing mainly on the differences with the embodiment of FIG. 8.

Referring to FIG. 14, a third vertical driving voltage line VVRL of a third driving voltage line VRL may be disposed between a first transistor T1 of the second subpixel SP2 and a data line DL of the third subpixel SP3. Thus, the first transistor T1 of the second subpixel SP2 can be effectively prevented or suppressed from being affected by the data line DL connected to the third subpixel SP3.

The third vertical driving voltage line VVRL may include a protruding part PP2 that protrudes in the first direction (or the X-axis direction) to be connected to a third driving connecting electrode VRE.

Figure 15:
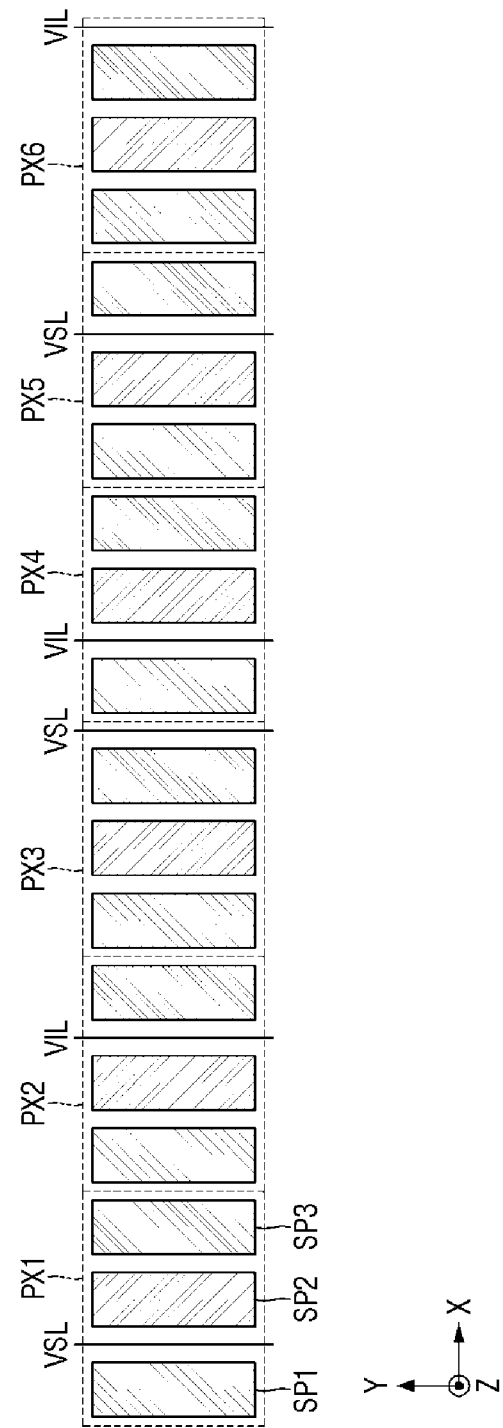
FIG. 15 is a layout view of pixels of a display panel according to another embodiment of the present disclosure.

FIG. 15 is a layout view of pixels of a display panel according to another embodiment of the present disclosure.

The embodiment of FIG. 15 differs from the embodiment of FIG. 5 in that the location of a first driving voltage line VSL in each of first, third, and fifth pixels PX1, PX3, and PX5 differs from the location of a second driving voltage line VIL in each of second, fourth, and sixth pixels PX2, PX4, and PX6.

Referring to FIG. 15, first driving voltage lines VSL and second driving voltage lines VIL may be alternately arranged in the first direction (or the X-axis direction). One of the first driving voltage lines VSL or one of the second driving voltage lines VIL may be arranged in each pixel PX.

The first driving voltage lines VSL and the second driving voltage lines VIL may be alternately arranged in the first direction (or the X-axis direction) between first and second subpixels SP1 and SP2 of a (3N−2)-th pixel PX(3N−2) (where N is a positive integer), between second and third subpixels SP2 and SP3 of a (3N−1)-th pixel PX(3N−1), and between a third subpixel SP3 of a 3N-th pixel PX3N and a first subpixel SP1 of a (3N+1)-th pixel PX(3N+1). For example, the first driving voltage lines VSL may be disposed between first and second subpixels SP1 and SP2 of the first pixel PX1, between a third subpixel SP3 of the third pixel PX3 and a first subpixel SP1 of the fourth pixel PX4, and between second and third subpixels SP2 and SP3 of the fifth pixel PX5, and the second driving voltage line VIL may be disposed between second and third subpixels SP2 and SP3 of the second pixel PX2, between first and second subpixels SP1 and SP2 of the fourth pixel PX4, and between a third subpixel SP3 of the sixth pixel PX6 and a first subpixel SP1 of a seventh pixel (not shown).

A first transistor T1 of the first subpixel SP1 of the (3N−2)-th pixel PX(3N−2) can be effectively prevented or suppressed from being affected by a data line DL connected to the second subpixel SP2 of the (3N−2)-th pixel PX(3N−2). A first transistor T1 of the second subpixel SP2 of the (3N−1)-th pixel PX(3N−1) can be prevented or suppressed from being affected by a data line DL connected to the third subpixel SP3 of the (3N−1)-th pixel PX(3N−1). A first transistor T1 of the third subpixel SP3 of the 3N-th pixel PX3N can be effectively prevented or suppressed from being affected by a data line DL connected to a first subpixel SP1 of the (3N+1)-th pixel PX(3N+1).

In the embodiment of FIG. 5, since the luminances of the first through sixth pixels PX1 through PX6 are affected the most by luminance variations in the second subpixels SP2 of the first through sixth pixels PX1 through PX6, the second subpixels SP2 of the first through sixth pixels PX1 through PX6 are blocked from their respective neighboring data lines DL using the first driving voltage lines VSL and the second driving voltage lines VIL to minimize luminance variations in the second subpixels SP2 of the first through sixth pixels PX1 through PX6. On the contrary, in the embodiment of FIG. 15, the first subpixels SP1, the second subpixels SP2, and the third subpixels SP3 of the first through sixth pixels PX1 through PX6 are alternately blocked using the first driving voltage lines VSL and the second driving voltage lines VIL, regardless of whether the luminances of the first through sixth pixels PX1 through PX6 are affected the most by luminance variations in the first subpixels SP1, the second subpixels SP2, or the third subpixels SP3 of the first through sixth pixels PX1 through PX6.

By arranging one of the first driving voltage lines VSL or one of the second driving voltage lines VIL between two adjacent subpixels SP of each pixel PX, as illustrated in FIG. 15, a first transistor T1 of one of the two adjacent subpixels SP can be effectively prevented or suppressed from being affected by a data line DL connected to a third subpixel SP3 of the corresponding pixel PX.

Figure 16:
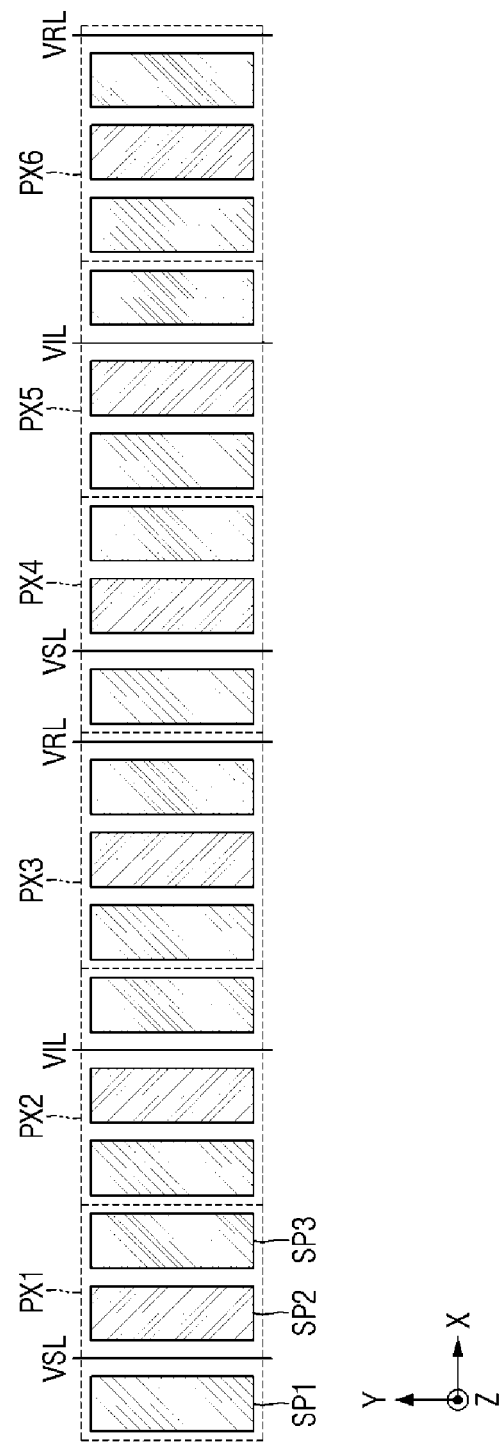
FIG. 16 is a layout view of pixels of a display panel according to another embodiment of the present disclosure.

FIG. 16 is a layout view of pixels of a display panel according to another embodiment of the present disclosure.

The embodiment of FIG. 16 differs from the embodiment of FIG. 15 in that first driving voltage lines VSL, second driving voltage lines VIL, and third driving voltage lines VRL are alternately arranged in the first direction (or the X-axis direction).

Referring to FIG. 16, the first driving voltage lines VSL, the second driving voltage lines VIL, and the third driving voltage lines VRL may be arranged in the order of a first driving voltage line VSL, a second driving voltage line VIL, and a third driving voltage line VRL in the first direction (or the X-axis direction), but the present disclosure according to the invention is not limited thereto. Alternatively, the first driving voltage lines VSL, the second driving voltage lines VIL, and the third driving voltage lines VRL may be arranged in the order of a second driving voltage line VIL, a first driving voltage line VSL, and a third driving voltage line VRL in the first direction (or the X-axis direction).

One of the first driving voltage lines VSL, one of the second driving voltage lines VIL, or one of the third driving voltage lines VRL may be disposed in each pixel PX. For example, the first driving voltage lines VSL may be disposed in first and fourth pixels PX1 and PX4, the second driving voltage lines VIL may be disposed in second and fifth pixels PX2 and PX5, and the third driving voltage lines VRL may be disposed in third and sixth pixels PX3 and PX6.

The locations of the first driving voltage lines VSL in the first and fourth pixels PX1 and PX3 may differ from the locations of the second driving voltage lines VIL in the second and fifth pixels PX2 and PX5. Also, the locations of the first driving voltage lines VSL in the first and fourth pixels PX1 and PX4 may differ from the locations of the third driving voltage lines VRL in the third and sixth pixels PX3 and PX6. Also, the locations of the second driving voltage lines VIL in the second and fifth pixels PX2 and PX5 may differ from the locations of the third driving voltage lines VRL in the third and sixth pixels PX3 and PX6.

In an embodiment, the first driving voltage lines VSL may be disposed between second and third subpixels SP2 and SP3 of the first pixel PX1 and between second and third subpixels SP2 and SP3 of the fourth pixel PX4, the second driving voltage lines VIL may be disposed between second and third subpixels SP2 and SP3 of the second pixel PX2 and between second and third subpixels SP2 and SP3 of the fifth pixel PX5, and the third driving voltage lines VRL may be disposed between a third subpixel SP3 of the third pixel PX3 and a first subpixel SP1 of the fourth pixel PX4 and between a third subpixel SP3 of the sixth pixel PX6 and a first subpixel SP1 of a seventh pixel (not shown).

In the embodiment of FIG. 16, the first subpixels SP1, the second subpixels SP2, and the third subpixels SP3 of the first through sixth pixels PX1 through PX6 are alternately blocked using the first driving voltage lines VSL and the second driving voltage lines VIL, regardless of whether the luminances of the first through sixth pixels PX1 through PX6 are affected the most by luminance variations in the first subpixels SP1, the second subpixels SP2, or the third subpixels SP3 of the first through sixth pixels PX1 through PX6.

By arranging one of the first driving voltage lines VSL, one of the second driving voltage lines VIL, or one of the third driving voltage lines VRL between two adjacent subpixels SP of each pixel PX, as illustrated in FIG. 16, a first transistor T1 of one of the two adjacent subpixels SP can be effectively prevented or suppressed from being affected by a data line DL connected to a third subpixel SP3 of the corresponding pixel PX.

Figure 17:
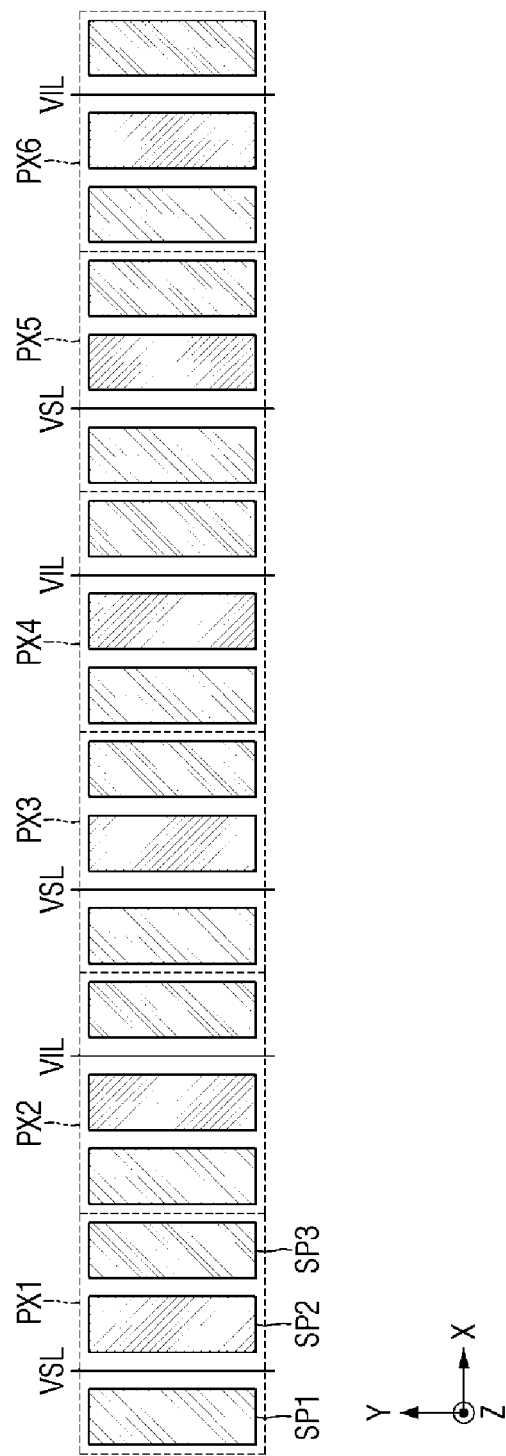
FIG. 17 is a layout view of pixels of a display panel according to another embodiment of the present disclosure.

FIG. 17 is a layout view of pixels of a display panel according to another embodiment of the present disclosure.

The embodiment of FIG. 17 differs from the embodiment of FIG. 5 in that the locations of first driving voltage lines VSL in first, third, and fifth pixels PX1, PX3, and PX5 differ from the locations of second driving voltage lines VIL in second, fourth, and sixth pixels PX2, PX4, and PX6.

Referring to FIG. 17, the first driving voltage lines VSL and the second driving voltage lines VIL may be alternately arranged in the first direction (or the X-axis direction). One of the first driving voltage lines VSL or one of the second driving voltage lines VIL may be disposed in each pixel PX.

The first driving voltage lines VSL and the second driving voltage lines VIL may be alternately arranged in the first direction (or the X-axis direction) between first and second subpixels SP1 and SP2 of a (2N−1)-th pixel PX(2N−1) and between second and third subpixels SP2 and SP3 of a 2N-th pixel PX2N.

In an embodiment, the first driving voltage lines VSL may be disposed between first and second subpixels SP1 and SP2 of the first pixel PX1, between first and second subpixels SP1 and SP2 of the third pixel PX3, and between first and second subpixels SP1 and SP2 of the fifth pixel PX5, and the second driving voltage lines VIL may be disposed between second and third subpixels SP2 and SP3 of the second pixel PX2, between second and third subpixels SP2 and SP3 of the fourth pixel PX4, and between second and third subpixels SP2 and SP3 of the sixth pixel PX6.

A first transistor of the first subpixel SP1 of the (2N−1)-th pixel PX(2N−1) can be effectively prevented or suppressed from being affected by a data line DL connected to the second subpixel SP2 of the (2N−1)-th pixel PX(2N−1). A first transistor T1 of the second subpixel SP2 of the 2N-th pixel PX2N can be prevented or suppressed from being affected by a data line DL connected to the third subpixel SP3 of the 2N-th pixel PX2N.

In the embodiment of FIG. 17, since the luminances of the first through sixth pixels PX1 through PX6 are more affected by the luminances of the first subpixels SP1 and the second subpixels SP2 of the first through sixth pixels PX1 through PX6 than by the luminances of the third subpixels SP3 of the first through sixth pixels PX1 through PX6, the first subpixels SP1 and the second subpixels SP2 of the first through sixth pixels PX1 through PX6 are alternately blocked using the first driving voltage lines VSL and the second driving voltage lines VIL to minimize luminance variations in the first subpixels SP1 and the second subpixels SP2 of the first through sixth pixels PX1 through PX6.

By arranging one of the first driving voltage lines VSL or one of the second driving voltage lines VIL between first and second subpixels SP1 and SP2 of each pixel PX or between the second subpixel SP2 and a third subpixel SP3 of each pixel PX, as illustrated in FIG. 17, a first transistor T1 of the first subpixel SP1 can be effectively prevented or suppressed from being affected by a data line DL connected to the second subpixel SP2, or a first transistor T1 of the second subpixel SP2 can be prevented or suppressed from being affected by a data line DL connected to the third subpixel SP3.

Figure 18:
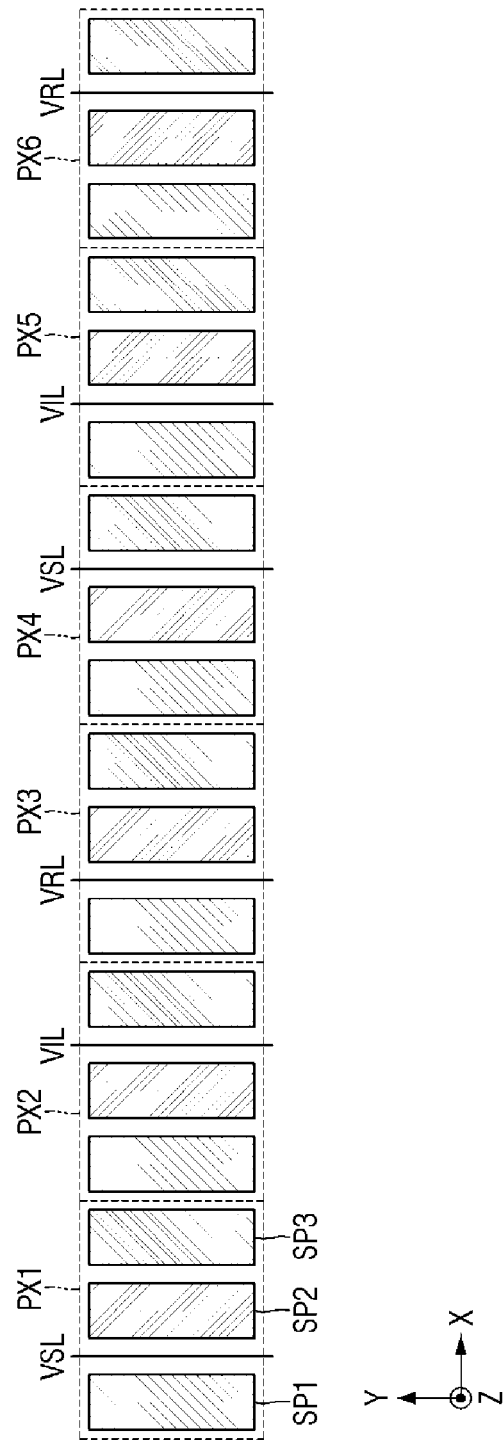
FIG. 18 is a layout view of pixels of a display panel according to another embodiment of the present disclosure.

FIG. 18 is a layout view of pixels of a display panel according to another embodiment of the present disclosure.

The embodiment of FIG. 18 differs from the embodiment of FIG. 17 in that first driving voltage lines VSL, second driving voltage lines VIL, and third driving voltage lines VRL are alternately arranged in the first direction (or the X-axis direction).

Referring to FIG. 18, the first driving voltage lines VSL, the second driving voltage lines VIL, and the third driving voltage lines VRL may be arranged in the order of a first driving voltage line VSL, a second driving voltage line VIL, and a third driving voltage line VRL in the first direction (or the X-axis direction), but the present disclosure according to the invention is not limited thereto. Alternatively, the first driving voltage lines VSL, the second driving voltage lines VIL, and the third driving voltage lines VRL may be arranged in the order of a second driving voltage line VIL, a first driving voltage line VSL, and a third driving voltage line VRL in the first direction (or the X-axis direction).

One of the first driving voltage lines VSL, one of the second driving voltage lines VIL, or one of the third driving voltage lines VRL may be disposed in each pixel PX. The first driving voltage lines VSL, the second driving voltage lines VIL, and the second driving voltage lines VRL may be alternately arranged in the first direction (or the X-axis direction) between first and second subpixels SP1 and SP2 of a (2N−1)-th pixel PX(2N−1) and between second and third subpixels SP2 and SP3 of a 2N-th pixel PX2N.

The location of the first driving voltage line VSL in the first pixel PX1 may be the same as the location of the third driving voltage line VRL in the third pixel PX3 and the location of the second driving voltage line VIL in the fifth pixel PX5. The location of the first driving voltage line VSL in the first pixel PX1 may differ from the location of the second driving voltage line VIL in the second pixel PX2, the location of the first driving voltage line VSL in the fourth pixel PX4, and the location of the third driving voltage line VRL in the sixth pixel PX6.

In an embodiment, the first driving voltage lines VSL may be disposed between first and second subpixels SP1 and SP2 of the first pixel PX1 and between second and third subpixels SP2 and SP3 of the fourth pixel PX4, the second driving voltage line VIL may be disposed between second and third subpixels SP2 and SP3 of the second pixel PX2 and between first and second subpixels SP1 and SP2 of the fifth pixel PX5, and the third driving voltage line VRL may be disposed between first and second subpixels SP1 and SP2 of the third pixel PX3 and between second and third subpixels SP2 and SP3 of the sixth pixel PX6.

In the embodiment of FIG. 18, since the luminances of the first through sixth pixels PX1 through PX6 are more affected by the luminances of the first subpixels SP1 and the second subpixels SP2 of the first through sixth pixels PX1 through PX6 than by the luminances of the third subpixels SP3 of the first through sixth pixels PX1 through PX6, the first subpixels SP1 and the second subpixels SP2 of the first through sixth pixels PX1 through PX6 are alternately blocked using the first driving voltage lines VSL, the second driving voltage lines VIL, and the third driving voltage lines VRL to minimize luminance variations in the first subpixels SP1 and the second subpixels SP2 of the first through sixth pixels PX1 through PX6.

By arranging one of the first driving voltage lines VSL, one of the second driving voltage lines VIL, or one of the third driving voltage lines VRL between first and second subpixels SP1 and SP2 of each pixel PX or between the second subpixel SP2 and a third subpixel SP3 of each pixel PX, as illustrated in FIG. 18, a first transistor T1 of the first subpixel SP1 can be effectively prevented or suppressed from being affected by a data line DL connected to the second subpixel SP2, or a first transistor T1 of the second subpixel SP2 can be prevented or suppressed from being affected by a data line DL connected to the third subpixel SP3.

Figure 19:
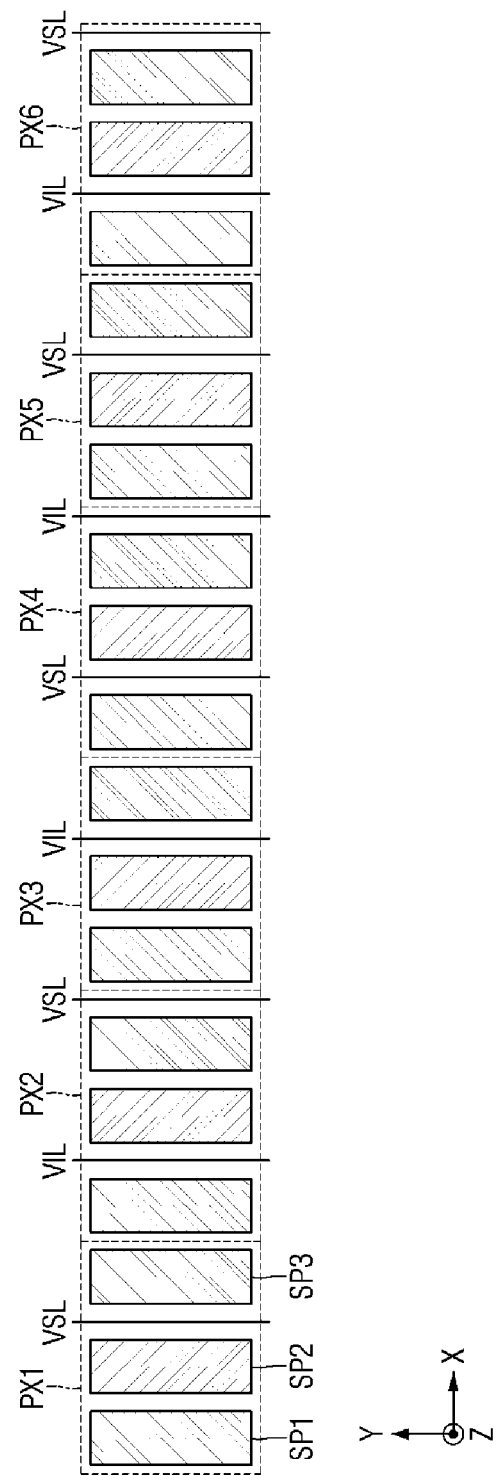
FIG. 19 is a layout view of pixels of a display panel according to another embodiment of the present disclosure.

FIG. 19 is a layout view of pixels of a display panel according to another embodiment of the present disclosure.

The embodiment of FIG. 19 differs from the embodiment of FIG. 5 in that a first driving voltage line VSL or a second driving voltage line VIL (i.e., one of a first driving voltage line VSL and a second driving voltage line VIL) is disposed in a (2N−1)-th pixel PX(2N−1) in the first direction (or the X-axis direction) and a first driving voltage line VSL and a second driving voltage line are both disposed in a 2N-th pixel PX2N in the first direction (or the X-axis direction).

Referring to FIG. 19, first driving voltage lines VSL and second driving voltage lines VIL may be alternately arranged in the first direction (or the X-axis direction). The first driving voltage lines VSL and the second driving voltage lines VIL may be alternately arranged in the first direction (or the X-axis direction) between second and third subpixels SP2 and SP3 of the (2N−1)-th pixel PX(2N−1), between first and second subpixels SP1 and SP2 of the 2N-th pixel PX2N, and between a third subpixel SP3 of the 2N-th pixel PX2N and a first subpixel SP1 of a (2N+1)-th pixel PX(2N+1).

In an embodiment, the first driving voltage lines VSL may be disposed between second and third subpixels SP2 and SP3 of a first pixel PX1, between a third subpixel SP3 of a second pixel PX2 and a first subpixel SP1 of a third pixel PX3, between first and second subpixels SP1 and SP2 of a fourth pixel PX4, between second and third subpixels SP2 and SP3 of a fifth pixel PX5, and between a third subpixel SP3 of a sixth pixel PX6 and a first subpixel SP1 of a seventh pixel (not shown), and the second driving voltage lines VIL may be disposed between first and second subpixels SP1 and SP2 of the second pixel PX2, between second and third subpixels SP2 and SP3 of the third pixel PX3, between a third subpixel SP3 of the fourth pixel PX4 and a first subpixel SP1 of the fifth pixel PX5, and between first and second subpixels SP1 and SP2 of the sixth pixel PX6.

A first transistor T1 of the second subpixel SP2 of the (2N−1)-th pixel PX(2N−1) can be effectively prevented or suppressed from being affected by a data line DL connected to the third subpixel SP3 of the (2N−1)-th pixel PX(2N−1). A first transistor T1 of the first subpixel SP1 of the 2N-th pixel PX2N can be prevented or suppressed from being affected by a data line DL connected to the second subpixel SP2 of the 2N-th pixel PX2N. A first transistor T1 of the third subpixel SP3 of the 2N-th pixel PX2N can be effectively prevented or suppressed from being affected by a data line DL connected to the first subpixel SP1 of the (2N+1)-th pixel PX(2N+1).

In the embodiment of FIG. 5, the first driving voltage lines VSL and the second driving voltage lines VIL are alternately arranged in units of every three subpixels SP in the first direction (or the X-axis direction), whereas in the embodiment of FIG. 19, the first driving voltage lines VSL and the second driving voltage lines VIL are alternately arranged in units of every two subpixels SP in the first direction (or the X-axis direction). Thus, the number of subpixels SP that can be blocked from data lines DL by the first driving voltage lines VSL and the second driving voltage lines VIL in the embodiment of FIG. 19 can be increased compared to that in the embodiment of FIG. 5.

Figure 20:
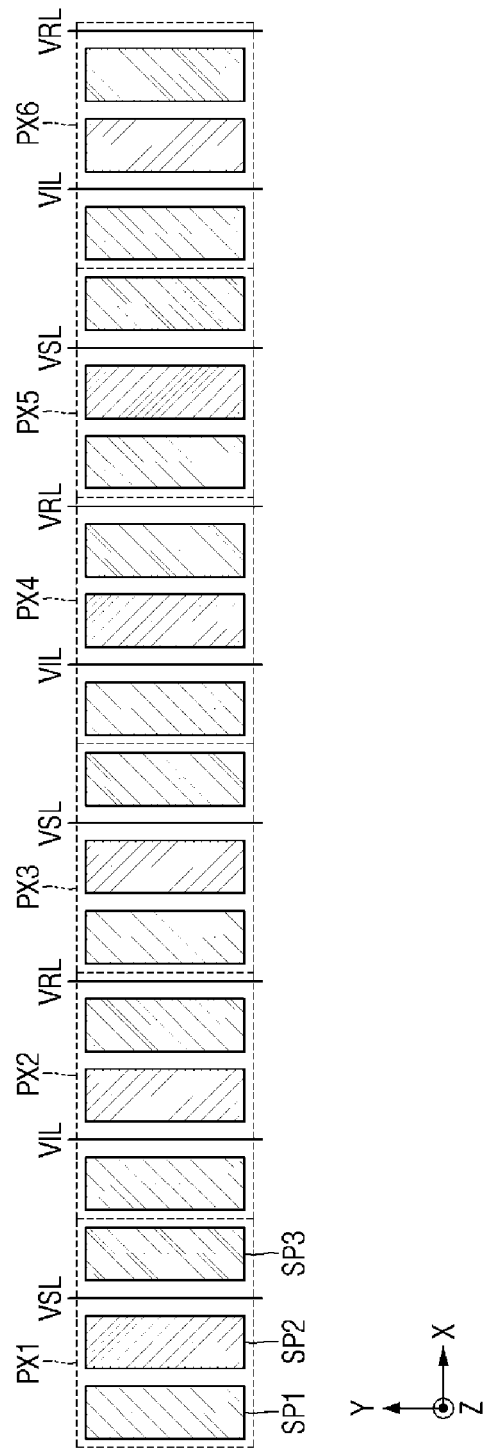
FIG. 20 is a layout view of pixels of a display panel according to another embodiment of the present disclosure.

FIG. 20 is a layout view of pixels of a display panel according to another embodiment of the present disclosure.

The embodiment of FIG. 20 differs from the embodiment of FIG. 19 in that first driving voltage lines VSL, second driving voltage lines VIL, and third driving voltage lines VRL are alternately arranged in the first direction (or the X-axis direction).

Referring to FIG. 20, the first driving voltage lines VSL, the second driving voltage lines VIL, and the third driving voltage lines VRL may be arranged in the order of a first driving voltage line VSL, a second driving voltage line VIL, and a third driving voltage line VRL in the first direction (or the X-axis direction), but the present disclosure according to the invention is not limited thereto. Alternatively, the first driving voltage lines VSL, the second driving voltage lines VIL, and the third driving voltage lines VRL may be arranged in the order of a second driving voltage line VIL, a first driving voltage line VSL, and a third driving voltage line VRL in the first direction (or the X-axis direction).

The first driving voltage lines VSL, the second driving voltage lines VIL, and the third driving voltage lines VRL may be alternately arranged in the first direction (or the X-axis direction) between second and third subpixels SP2 and SP3 of a (2N−1)-th pixel PX(2N−1), between first and second subpixels SP1 and SP2 of a 2N-th pixel PX2N, and between a third subpixel SP3 of the 2N-th pixel PX2N and a first subpixel SP1 of a 2(N+1)-th pixel PX(2N+1), respectively.

The location of the first driving voltage line VSL in the first pixel PX1 may be the same as the location of the first driving voltage line VSL in the third pixel PX3 and the location of the first driving voltage line VSL in the fifth pixel PX5. The location of the second driving voltage line VIL in the second pixel PX2 may differ from the location of the second driving voltage line VIL in the fourth pixel PX4 and the location of the second driving voltage line VIL in the sixth pixel PX6. The location of the third driving voltage line VRL in the second pixel PX2 may be the same as the location of the third driving voltage line VRL in the fourth pixel PX4 and the location of the third driving voltage line VRL in the sixth pixel PX6.

In an embodiment, the first driving voltage lines VSL may eb disposed between second and third subpixels of the first pixel PX1, between second and third subpixels of the third pixel PX3, and between second and third subpixels of the fifth pixel PX5, the second driving voltage lines VIL may be disposed between first and second subpixels SP1 and SP2 of the second pixel PX2, between first and second subpixels SP1 and SP2 of the fourth pixel PX2, and between first is and second subpixels SP1 and SP2 of the sixth pixel PX6, and the third driving voltage lines VRL may be disposed between a third subpixel SP3 of the second pixel PX2 and a first subpixel SP1 of the third pixel PX3, between a third subpixel SP3 of the fourth pixel PX4 and a first subpixel SP1 of the fifth pixel PX5, and between a third subpixel SP3 of the sixth pixel PX6 and a first subpixel SP1 of a seventh pixel (not shown).

In the embodiment of FIG. 20, the first driving voltage lines VSL, the second driving voltage lines VIL, and the third driving voltage lines VRL are alternately arranged in units of every two subpixels SP in the first direction (or the X-axis direction). Thus, the number of subpixels SP that can be blocked from data lines DL by the first driving voltage lines VSL, the second driving voltage lines VIL, and the third driving voltage lines VRL can be increased.

Figure 21:
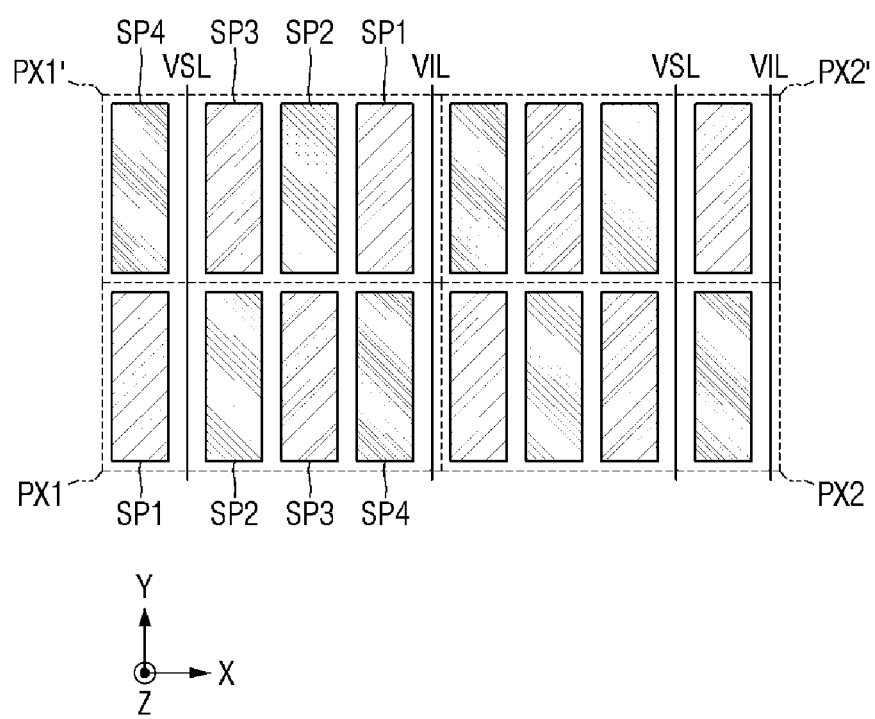
FIG. 21 is a layout view of pixels of a display panel according to another embodiment of the present disclosure.

FIG. 21 is a layout view of pixels of a display panel according to another embodiment of the present disclosure.

Referring to FIG. 21, each of pixels PX1, PX2, PX1', and PX2' may include first, second, third, and fourth subpixels SP1, SP2, SP3, and SP4, which are arranged in the first direction (or the X-axis direction). The first, second, third, and fourth subpixels SP1, SP2, SP3, and SP4 may emit light of first, second, third, and fourth colors, respectively. That is, the first, second, third, and fourth subpixels SP1, SP2, SP3, and SP4 may emit light of different colors. Alternatively, two of the first, second, third, and fourth subpixels SP1, SP2, SP3, and SP4 may emit light of the same color. For example, the second and fourth subpixels SP2 and SP4 may emit light of the same color. In this example, the first color may be red, the second and fourth colors may be green, and the third color may be blue, but the present disclosure according to the invention is not limited thereto. Each of the pixels PX1, PX2, PX1', and PX2' is illustrated as including four subpixels SP, but the number of subpixels SP included in each of the pixels PX1, PX2, PX1', and PX2' is not particularly limited.

First and second pixels PX1 and PX2 may be alternately arranged in the first direction (or the X-axis direction). 1'- and 2'-th pixels PX1' and PX2' may be alternately arranged in the first direction (or the X-axis direction). The first and 1'-th pixels PX1 and PX1' may be alternately arranged in the second direction (or the Y-axis direction). The second and 2'-th pixels PX2 and PX2' may be alternately arranged in the second direction (or the Y-axis direction).

In each of the first and second pixels PX1 and PX2, the first, second, third, and fourth subpixels SP1, SP2, SP3, and SP4 may be sequentially arranged from left to right. On the contrary, in each of the 1'- and 2'-th pixels PX1' and PX2', the first, second, third, and fourth subpixels SP1, SP2, SP3, and SP4 may be sequentially arranged from right to left.

The first subpixel SP1 of the first pixel PX1 and the fourth subpixel SP4 of the 1'-th pixel PX1' may be arranged in the second direction (or the Y-axis direction). The second subpixel SP2 of the first pixel PX1 and the third subpixel SP3 of the 1'-th pixel PX1' may be arranged in the second direction (or the Y-axis direction). The third subpixel SP3 of the first pixel PX1 and the second subpixel SP2 of the 1'-th pixel PX1' may be arranged in the second direction (or the Y-axis direction). The fourth subpixel SP4 of the first pixel PX1 and the first subpixel SP1 of the 1'-th pixel PX1' may be arranged in the second direction (or the Y-axis direction).

The first subpixel SP1 of the second pixel PX2 and the fourth subpixel SP4 of the 2'-th pixel PX2' may be arranged in the second direction (or the Y-axis direction). The second subpixel SP2 of the second pixel PX2 and the third subpixel SP3 of the 2'-th pixel PX2' may be arranged in the second direction (or the Y-axis direction). The third subpixel SP3 of the second pixel PX2 and the second subpixel SP2 of the 2'-th pixel PX2' may be arranged in the second direction (or the Y-axis direction). The fourth subpixel SP4 of the second pixel PX2 and the first subpixel SP1 of the 2'-th pixel PX2' may be arranged in the second direction (or the Y-axis direction).

First driving voltage lines VSL and second driving voltage lines VIL may extend in the second direction (or the Y-axis direction). The first driving voltage lines VSL and the second driving voltage lines VIL may be alternately arranged in the first direction (or the X-axis direction). That is, the first driving voltage lines VSL and the second driving voltage lines VIL may be arranged in the order of a first driving voltage line VSL, a second driving voltage line VIL, a first driving voltage line VSL, and a second driving voltage line VIL in the first direction (or the X-axis direction). One of the first driving voltage lines VSL and one of the second driving voltage lines VIL may be disposed in each pixel PX.

The location of the first driving voltage line VSL in the first pixel PX1 may differ from the location of the first driving voltage line VSL in the second pixel PX2. The location of the second driving voltage line VIL in the first pixel PX1 may be the same as the location of the second driving voltage line VIL in the second pixel PX2. The location of the first driving voltage line VSL in the first pixel PX1 may differ from the location of the second driving voltage line VIL in the first pixel PX1 and the location of the second driving voltage line VIL in the second pixel PX2.

The first driving voltage lines VSL and the second driving voltage lines VIL may be alternately arranged in the first direction (or the X-axis direction) between first and second subpixels SP1 and SP2 of a (2N−1)-th pixel PX(2N−1), between a fourth subpixel SP4 of the (2N−1)-th pixel PX(2N−1) and a first subpixel SP1 of a 2N-th pixel PX2N, between third and fourth subpixels SP3 and SP4 of the 2N-th pixel PX2N, and between a fourth subpixel SP4 of the 2N-th pixel PX2N and a first subpixel SP1 of a (2N+1)-th pixel PX(2N+1).

In an embodiment, the first driving voltage lines VSL may be disposed between the first and second subpixels SP1 and SP2 of the first pixel PX1 and between the third and fourth subpixels SP3 and SP4 of the second pixel PX2, and the second driving voltage lines VIL may be disposed between the fourth subpixel SP4 of the first pixel PX1 and the first subpixel SP1 of the second pixel PX2 and between the fourth subpixel SP4 of the second pixel PX2 and a first subpixel SP1 of a third pixel PX3.

The location of the first driving voltage line VSL in the 1'-th pixel PX1' may differ from the location of the first driving voltage line VSL in the 2'-th pixel PX2'. The location of the second driving voltage line VIL in the 1'-th pixel PX1' may be the same as the location of the second driving voltage line VIL in the 2'-th pixel PX2'. The location of the first driving voltage line VSL in the 1'-th pixel PX1' may differ from the location of the second driving voltage line VIL in the 1'-th pixel PX1' and the location of the second driving voltage line VIL in the 2'-th pixel PX2'.

The first driving voltage lines VSL and the second driving voltage lines VIL may be alternately arranged in the first direction (or the X-axis direction) between third and fourth subpixels SP3 and SP4 of a (2N−1)'-th pixel PX(2N−1)', between a first subpixel SP1 of the (2N−1)'-th pixel PX(2N−1)' and a fourth subpixel SP4 of a 2N'-th pixel PX2N', between first and second subpixels SP1 and SP2 of the 2N'-th pixel PX2N', and between a first subpixel SP1 of the 2N'-th pixel PX2N' and a fourth subpixel SP4 of a (2N+1)'-th pixel PX(2N+1)'.

In an embodiment, the first driving voltage lines VSL may be disposed between the third and fourth subpixels SP3 and SP4 of the 1'-th pixel PX1' and between the first and second subpixels SP1 and SP2 of the 2'-th pixel PX2', and the second driving voltage lines VIL may be disposed between the first subpixel SP1 of the 1'-th pixel PX1' and the fourth subpixel SP4 of the 2'-th pixel PX2' and between the first subpixel SP1 of the 2'-th pixel PX2' and a fourth subpixel SP4 of a 3'-th pixel PX3'.

In the embodiment of FIG. 21, first, third, and fourth subpixels SP1, SP3, and SP4 that are adjacent to one another, between every two adjacent pixels PX in the first direction (or the X-axis direction) or in the second direction (or the Y-axis direction), can be blocked using the first driving voltage lines VSL and the second driving voltage lines VIL, regardless of which of first through fourth subpixels SP1 through SP4 of each pixel PX affect the luminance of the corresponding pixel PX the most. Accordingly, first transistors T1 of the first, third, and fourth subpixels SP1, SP3, and SP4 can be effectively prevented or suppressed from being affected by their respective neighboring data lines DL.

Figure 22:
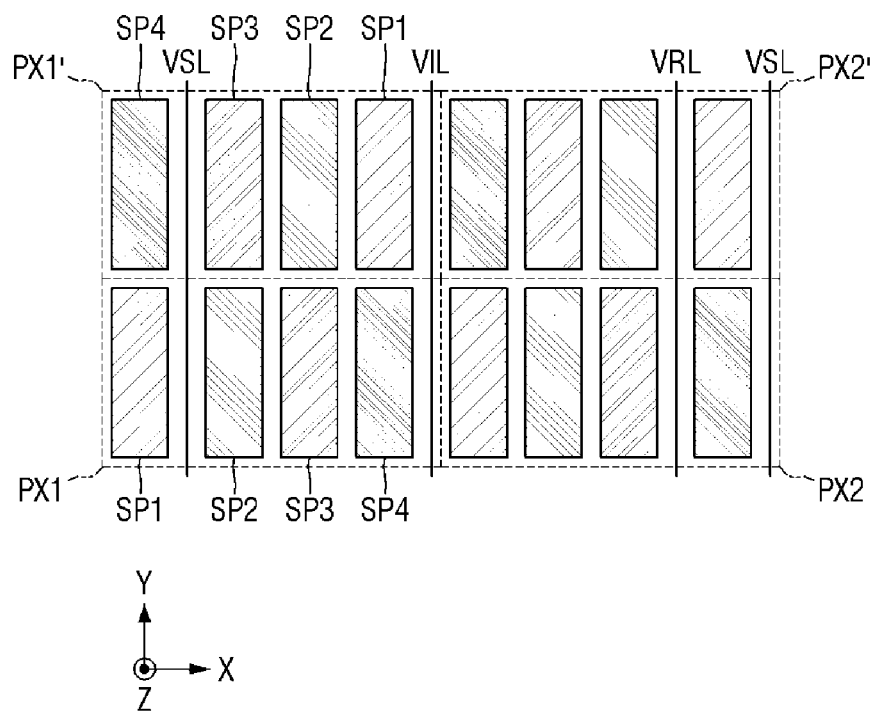
FIG. 22 is a layout view of pixels of a display panel according to another embodiment of the present disclosure.

FIG. 22 is a layout view of pixels of a display panel according to another embodiment of the present disclosure.

The embodiment of FIG. 22 differs from the embodiment of FIG. 21 in that first driving voltage lines VSL, second driving voltage lines VIL, and third driving voltage lines VRL are alternately arranged in the first direction (or the X-axis direction).

Referring to FIG. 22, the first driving voltage lines VSL, the second driving voltage lines VIL, and the third driving voltage lines VRL may be arranged in the order of a first driving voltage line VSL, a second driving voltage line VIL, and a third driving voltage line VRL in the first direction (or the X-axis direction), but the present disclosure according to the invention is not limited thereto. Alternatively, the first driving voltage lines VSL, the second driving voltage lines VIL, and the third driving voltage lines VRL may be arranged in the order of a second driving voltage line VIL, a first driving voltage line VSL, and a third driving voltage line VRL in the first direction (or the X-axis direction).

The first driving voltage lines VSL, the second driving voltage lines VIL, and the third driving voltage lines VRL may be alternately arranged in the first direction (or the X-axis direction) between first and second subpixels SP1 and SP2 of a (2N−1)-th pixel PX(2N−1), between a fourth subpixel SP4 of the (2N−1)-th pixel PX(2N−1) and a first subpixel SP1 of a 2N-th pixel PX2N, between third and fourth subpixels SP3 and SP4 of the 2N-th pixel PX2N, and between a fourth subpixel SP4 of the 2N-th pixel PX2N and a first subpixel SP1 of a (2N+1)-th pixel PX(2N+1).

In an embodiment, the first driving voltage lines VSL may be disposed between first and second subpixels SP1 and SP2 of a first pixel PX1 and between a fourth subpixel SP4 of a second pixel PX2 and a first subpixel PX1 of a third pixel PX3, one of the second driving voltage lines VIL may be disposed between third and fourth subpixels SP3 and SP4 of the second pixel PX2, and one of the third driving voltage lines VRL may be disposed between a fourth subpixel SP4 of the first pixel PX1 and a first subpixel SP1 of the second pixel PX2.

Also, the first driving voltage lines VSL, the second driving voltage lines VIL, and the third driving voltage lines VRL may be alternately arranged in the first direction (or the X-axis direction) between third and fourth subpixels SP3 and SP4 of a (2N−1)'-th pixel PX(2N−1)', between a first subpixel SP1 of the (2N−1)'-th pixel PX(2N−1)' and a fourth subpixel SP4 of a 2N'-th pixel PX2N', between first and second subpixels SP1 and SP2 of the 2N'-th pixel PX2N', and between a first subpixel SP1 of the 2N'-th pixel PX2N' and a fourth subpixel SP4 of a (2N+1)'-th pixel PX(2N+1).

In an embodiment, the first driving voltage lines VSL may be disposed between third and fourth subpixels SP3 and SP4 of a 1'-th pixel PX1' and between a first subpixel SP1 of a 2'-th pixel PX2' and a fourth subpixel PX4 of a 3'-th pixel PX3', one of the second driving voltage lines VIL may be disposed between a first subpixel SP1 of the 1'-th pixel PX1' and a fourth subpixel SP4 of the 2'-th pixel PX2', and one of the third driving voltage lines VRL may be disposed between first and second subpixels SP1 and SP2 of the 2'-th pixel PX2'.

In the embodiment of FIG. 22, first, third, and fourth subpixels SP1, SP3, and SP4 that are adjacent to one another, between every two adjacent pixels PX in the first direction (or the X-axis direction) or in the second direction (or the Y-axis direction), can be blocked using the first driving voltage lines VSL and the second driving voltage lines VIL, regardless of which of first through fourth subpixels SP1 through SP4 of each pixel PX affect the luminance of the corresponding pixel PX the most. Accordingly, first transistors T1 of the first, third, and fourth subpixels SP1, SP3, and SP4 can be effectively prevented or suppressed from being affected by their respective neighboring data lines DL.

Figure 23:
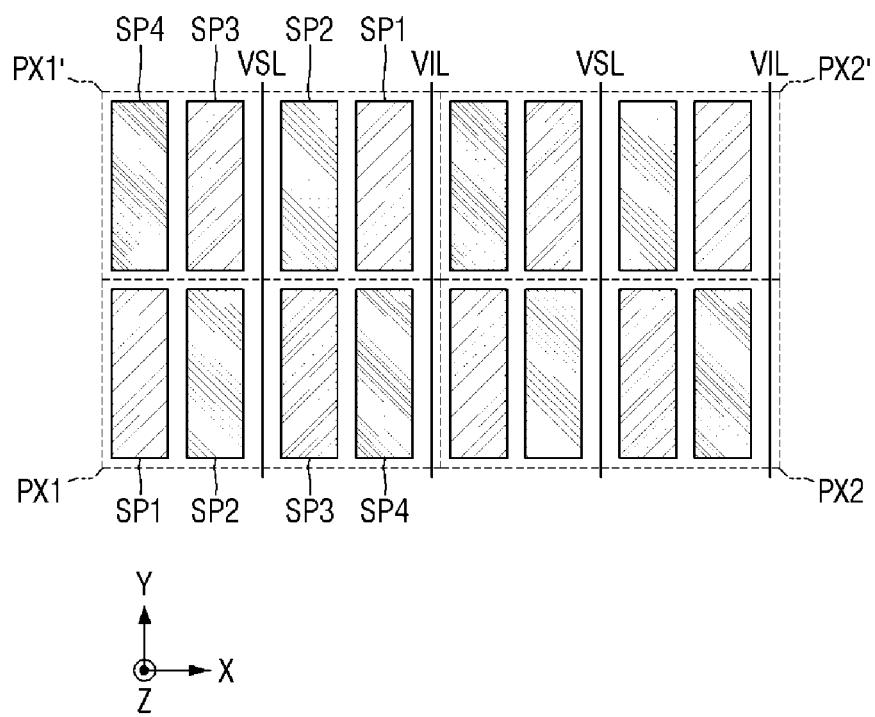
FIG. 23 is a layout view of pixels of a display panel according to another embodiment of the present disclosure.

FIG. 23 is a layout view of pixels of a display panel according to another embodiment of the present disclosure.

The embodiment of FIG. 23 differs from the embodiment of FIG. 21 in that first driving voltage lines VSL are disposed between second and third subpixels SP2 and SP3 of a first pixel PX1, between second and third subpixels SP2 and SP3 of a 1'-th pixel PX1', between second and third subpixels SP2 and SP3 of a second pixel PX2, and between second and third subpixels SP2 and SP3 of a 2'-th pixel PX2'.

Referring to FIG. 23, the first driving voltage lines VSL and the second driving voltage lines VIL may be alternately arranged in the first direction (or the X-axis direction) between second and third subpixels SP2 and SP3 of a (2N−1)-th pixel PX(2N−1), between a fourth subpixel SP4 of the (2N−1)-th pixel PX(2N−1) and a first subpixel SP1 of a 2N-th pixel PX2N, between second and third subpixels SP2 and SP3 of the 2N-th pixel PX2N, and between a fourth subpixel SP4 of the 2N-th pixel PX2N and a first subpixel SP1 of a (2N+1)-th pixel PX(2N+1).

In an embodiment, the first driving voltage lines VSL may be disposed between the second and third subpixels SP2 and SP3 of the first pixel PX1 and between the second and third subpixels SP2 and SP3 of the second pixel PX2, and the second driving voltage lines VIL may be disposed between a fourth subpixel SP4 of the first pixel PX1 and a first subpixel SP1 of the second pixel PX2 and between a fourth subpixel SP4 of the second pixel PX2 and a first subpixel SP1 of a third pixel PX3.

Also, the first driving voltage lines VSL and the second driving voltage lines VIL may be alternately arranged in the first direction (or the X-axis direction) between second and third subpixels SP2 and SP3 of a (2N−1)'-th pixel PX(2N−1)', between a first subpixel SP1 of the (2N−1)'-th pixel PX(2N−1)' and a fourth subpixel SP4 of a 2N'-th pixel PX2N', between second and third subpixels SP2 and SP3 of the 2N'-th pixel PX2N', and between a first subpixel SP1 of the 2N'-th pixel PX2N' and a fourth subpixel SP4 of a (2N+1)'-th pixel PX(2N+1)'.

In an embodiment, the first driving voltage lines VSL may be disposed between the second and third subpixels SP2 and SP3 of the 1'-th pixel PX1' and between the second and third subpixels SP2 and SP3 of the 2'-th pixel PX2', and the second driving voltage lines VIL may be disposed between a first subpixel SP1 of the 1'-th pixel PX1' and a fourth subpixel SP4 of the 2'-th pixel PX2' and between a first subpixel SP1 of the 2'-th pixel PX2' and a fourth subpixel SP4 of a 3'-th pixel PX3'.

As illustrated in FIG. 23, since the luminance of each pixel PX is affected the most by their subpixels SP emitting green light, i.e., second and fourth subpixels SP2 and SP4, second and fourth subpixels SP2 and SP4 in every two adjacent subpixels in the first direction (or the X-axis direction) or in the second direction (or the Y-axis direction) can be blocked using the first driving voltage lines VSL and the second driving voltage lines VIL. Thus, first transistors T1 of the second and fourth subpixels SP2 and SP4 can be effectively prevented or suppressed from being affected by their respective neighboring data lines DL.

Figure 24:
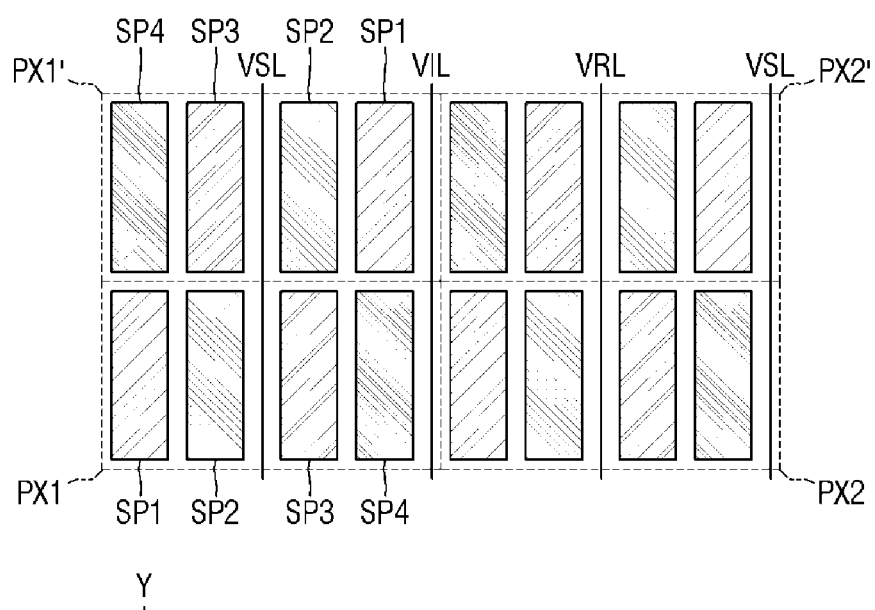
FIG. 24 is a layout view of pixels of a display panel according to another embodiment of the present disclosure.

FIG. 24 is a layout view of pixels of a display panel according to another embodiment of the present disclosure.

The embodiment of FIG. 24 differs from the embodiment of FIG. 23 in that first driving voltage lines VSL, second driving voltage lines VIL, and third driving voltage lines VRL are alternately arranged in the first direction (or the X-axis direction).

Referring to FIG. 24, the first driving voltage lines VSL, the second driving voltage lines VIL, and the third driving voltage lines VRL may be arranged in the order of a first driving voltage line VSL, a second driving voltage line VIL, and a third driving voltage line VRL in the first direction (or the X-axis direction), but the present disclosure according to the invention is not limited thereto. Alternatively, the first driving voltage lines VSL, the second driving voltage lines VIL, and the third driving voltage lines VRL may be arranged in the order of a second driving voltage line VIL, a first driving voltage line VSL, and a third driving voltage line VRL in the first direction (or the X-axis direction).

The first driving voltage lines VSL, the second driving voltage lines VIL, and the second driving voltage lines VRL may be alternately arranged in the first direction (or the X-axis direction) between second and third subpixels SP2 and SP3 of a (2N−1)-th pixel PX(2N−1), between a fourth subpixel SP4 of the (2N−1)-th pixel PX(2N−1) and a first subpixel SP1 of a 2N-th pixel PX2N, between second and third subpixels SP2 and SP3 of the 2N-th pixel PX2N, and between a fourth subpixel SP4 of the 2N-th pixel PX2N and a fourth subpixel SP4 of a 2(N+1)-th pixel PX(2N+1).

In an embodiment, the first driving voltage lines VSL may be disposed between second and third subpixels SP2 and SP3 of a first pixel PX1 and between a fourth subpixel SP4 of a second pixel PX2 and a first subpixel PX1 of a third pixel PX3, one of the second driving voltage lines VIL may be disposed between a fourth subpixel SP4 of the first pixel PX1 and a first subpixel SP1 of the second pixel PX2, and one of the third driving voltage lines VRL may be disposed between second and third subpixels SP2 and SP3 of the second pixel PX2.

Also, the first driving voltage lines VSL, the second driving voltage lines VIL, and the is third driving voltage lines VRL may be alternately arranged in the first direction (or the X-axis direction) between second and third subpixels SP2 and SP3 of a (2N−1)'-th pixel PX(2N−1)', between a first subpixel SP1 of the (2N−1)'-th pixel PX(2N−1)' and a fourth subpixel SP4 of a 2N'-th pixel PX2N', between second and third subpixels SP2 and SP3 of the 2N'-th pixel PX2N', and between a first subpixel SP1 of the 2N'-th pixel PX2N' and a fourth subpixel SP4 of a (2N+1)'-th pixel PX(2N+1)'.

In an embodiment, the first driving voltage lines VSL may be disposed between second and third subpixels SP2 and SP3 of a 1'-th pixel PX1' and between a first subpixel SP1 of a 2'-th pixel PX2' and a fourth subpixel PX4 of a 3'-th pixel PX3', one of the second driving voltage lines VIL may be disposed between a first subpixel SP1 of the 1'-th pixel PX1' and a fourth subpixel SP4 of the 2'-th pixel PX2', and one of the third driving voltage lines VRL may be disposed between second and third subpixels SP2 and SP3 of the 2'-th pixel PX2'.

As illustrated in FIG. 24, since the luminance of each pixel PX is affected the most by their subpixels SP emitting green light, i.e., second and fourth subpixels SP2 and SP4, second and fourth subpixels SP2 and SP4 in every two adjacent subpixels in the first direction (or the X-axis direction) or in the second direction (or the Y-axis direction) can be blocked using the first driving voltage lines VSL and the second driving voltage lines VIL. Thus, first transistors T1 of the second and fourth subpixels SP2 and SP4 can be effectively prevented or suppressed from being affected by their respective neighboring data lines DL.

In embodiments of the display device, since in each pixel, a driving voltage line is disposed between adjacent subpixels, a first transistor of one subpixel can be prevented or suppressed from being affected by a data line connected to a neighboring subpixel.

The invention should not be construed as being limited to the embodiments set forth herein. Rather, these embodiments are provided so that this invention will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
scan lines extending in a first direction;
data lines extending in a second direction that intersects the first direction and which receive data voltages;
first driving voltage lines extending in the second direction and which receive a first driving voltage;
second driving voltage lines extending in the second direction and which receive a second driving voltage, the second driving voltage being different from the first driving voltage; and
pixels connected to the scan lines and the data lines, wherein
each of the pixels includes first, second, and third subpixels, which are arranged in the first direction,
the first driving voltage lines and the second driving voltage lines are alternately arranged in the first direction,
one of two subpixels adjacent to one of the first driving voltage lines in a first pixel among the pixels differs from two subpixels adjacent to one of the second driving voltage lines in a second pixel among the pixels, and
the second pixel is adjacent to the first pixel in the first direction.

2. The display device of claim 1, wherein at least one of the first driving voltage lines and the second driving voltage lines is disposed in each of the pixels.

3. The display device of claim 1, wherein the first driving voltage lines and the second driving voltage lines are alternately arranged in the first direction between the first and second subpixels of a (3N-2)-th pixel among the pixels, between the second and third subpixels of a (3N-1)-th pixel among the pixels, and between the third subpixel of a 3N-th pixel among the pixels and the first subpixel of a (3N+1)-th pixel among the pixels, and N is a positive integer.

4. The display device of claim 1, wherein
the one of the first driving voltage lines is disposed between the first and second subpixels of the first pixel, and
the one of the second driving voltage lines is disposed between the second and third subpixels of the second pixel.

5. The display device of claim 1, wherein
another of the first driving voltage lines is disposed between the third subpixel of a third pixel among the pixels and the first subpixel of a fourth pixel among the pixels,
another of the second driving voltage lines is disposed between the first subpixel and the second subpixel of the fourth pixel,
the third pixel is adjacent to the second pixel in the first direction, and
the fourth pixel is adjacent to the third pixel in the first direction.

6. The display device of claim 5, wherein
still another of the first driving voltage lines is disposed between the second and third subpixels of a fifth pixel among the pixels,
still another of the second driving voltage lines is disposed between the third subpixel of a sixth pixel among the pixels and the first subpixel of a seventh pixel among the pixels,
the fifth pixel is adjacent to the fourth pixel in the first direction,
the sixth pixel is adjacent to the fifth pixel in the first direction, and
the seventh pixel is adjacent to the sixth pixel in the first direction.

7. The display device of claim 1, wherein the first driving voltage lines and the second driving voltage lines are alternately arranged in the first direction between the first and second subpixels of a (2N-1)-th pixel among the pixels and between the second and third subpixels of a 2N-th pixel among the pixels, and N is a positive integer.

8. The display device of claim 1, wherein the location of the one of the first driving voltage lines in the first pixel among the pixels is between a first transistor of the one of the subpixels and a data line among the data lines, connected to a next subpixel in the first pixel.

9. The display device of claim 1, wherein
another of the first driving voltage lines is disposed between the first and second subpixels of a third pixel among the pixels,
another of the second driving voltage lines is disposed between the second and third subpixels of a fourth pixel among the pixels,
the third pixel is adjacent to the second pixel in the first direction, and
the fourth pixel is adjacent to the third pixel in the first direction.

10. The display device of claim 1, wherein the first driving voltage lines and the second driving voltage lines are alternately arranged in the first direction between the second and third subpixels of a (2N-1)-th pixel among the pixels, between the first and second subpixels of a 2N-th pixel among the pixels, and between the third subpixel of the 2N-th pixel and the first subpixel of a (2N+1)-th pixel among the pixels, and N is a positive integer.

11. The display device of claim 1, wherein
the one of the first driving voltage lines is disposed between the second and third subpixels of the first pixel, and
the one of the second driving voltage lines is disposed between the first and second subpixels of the second pixel.

12. The display device of claim 1, wherein
another of the first driving voltage lines is disposed between the third subpixel of the second pixel and the first subpixel of a third pixel among the pixels,
another of the second driving voltage lines is disposed between the second and third subpixels of the third pixel, and
the third pixel is adjacent to the second pixel in the first direction.

13. The display device of claim 12, wherein
still another of the first driving voltage lines is disposed between the first and second subpixels of a fourth pixel among the pixels,
still another of the second driving voltage lines is disposed between the third subpixel of the fourth pixel and the first subpixel of a fifth pixel among the pixels,
the fourth pixel is adjacent to the third pixel in the first direction, and
the fifth pixel is adjacent to the fourth pixel in the first direction.

14. A display device comprising:
scan lines extending in a first direction;
data lines extending in a second direction that intersects the first direction and which receive data voltages;
first driving voltage lines extending in the second direction and which receive a first driving voltage applied;
second driving voltage lines extending in the second direction and which receive a second driving voltage the second driving voltage being different from the first driving voltage;
third driving voltage lines extending in the second direction and which receive a third driving voltage, the third driving voltage being different from each of the first and second driving voltages; and
pixels connected to the scan lines and the data lines,
wherein
each of the pixels includes first, second, and third subpixels, which are arranged in the first direction,
the first driving voltage lines, the second driving voltage lines, and the third driving voltage lines are alternately arranged in the first direction,
a location of one of the first driving voltage lines in a first pixel among the pixels differs from a location of one of the second driving voltage lines in a second pixel among the pixels,
the second pixel is adjacent to the first pixel in the first direction, and
at least one of the first driving voltage lines, the second driving voltage lines, and the third driving voltage lines is disposed in each of the pixels.

15. The display device of claim 14, wherein a location of one of the third driving voltage lines in a third pixel among the pixels differs from the location of the first driving voltage line in the first pixel and the location of the second driving voltage line in the second pixel.

16. The display device of claim 14, wherein the first driving voltage lines, the second driving voltage lines, and the third driving voltage lines are alternately arranged in the first direction between the first and second subpixels of a (3N-2)-th pixel among the pixels, between the second and third subpixels of a (3N-1)-th pixel among the pixels, and between the third subpixel of a 3N-th pixel among the pixels and the first subpixel of a (3N+1)-th pixel among the pixels, and N is a positive integer.

17. The display device of claim 14, wherein a location of one of the third driving voltage lines in a third pixel among the pixels is the same as the location of the first driving voltage line in the first pixel and different from the location of the second driving voltage line in the second pixel.

18. The display device of claim 14, wherein the first driving voltage lines, the second driving voltage lines, and the third driving voltage lines are alternately arranged in the first direction between the first and second subpixels of a (2N-1)-th pixel among the pixels and between the second and third subpixels of a 2N-th pixel among the pixels, and N is a positive integer.

19. The display device of claim 14, wherein the location of the second driving voltage line in the second pixel differs from the location of the first driving voltage line in the first pixel and a location of one of the third driving voltage lines in the second pixel.

20. The display device of claim 14, wherein the first driving voltage lines, the second driving voltage lines, and the third driving voltage lines are alternately arranged in the first direction between the second and third subpixels of a (2N-1)-th pixel among the pixels, between the first and second subpixels of a 2N-th pixel among the pixels, and between the third subpixel of the 2N-th pixel and the first subpixel of a (2N+1)-th pixel among the pixels, and N is a positive integer.

21. The display device of claim 14, wherein each of the first, second, and third subpixels includes:
a first transistor which controls a driving current that flows between first and second electrodes of the first transistor in accordance with a voltage applied to a gate electrode of the first transistor;
a light-emitting element connected between the first transistor and one of the first driving voltage lines;
a second transistor connected between a first electrode of the light-emitting element and one of the second driving voltage lines; and
a first capacitor connected between a second electrode of the first transistor and a third transistor,
wherein the third transistor is connected between the first capacitor and one of the third driving voltage lines.

22. A display device comprising:
scan lines extending in a first direction;
data lines extending in a second direction that intersects the first direction and which receive data voltages;
first driving voltage lines extending in the second direction and which receive a first driving voltage;
second driving voltage lines extending in the second direction and which receive a second driving voltage, the second driving voltage being different from the first driving voltage; and
pixels connected to the scan lines and the data lines,
wherein
each of the pixels includes first, second, third, and fourth subpixels, which are arranged in the first direction,
one of the first driving voltage lines and one of the second driving voltage lines are disposed in each of the pixels,
a total number of pixels connected to one scan line, a total number of the first driving voltage lines, and a total number of the second driving voltage lines are the same.

23. The display device of claim 22, wherein the first driving voltage lines and the second driving voltage lines are alternately arranged in the first direction.

24. The display device of claim 22, wherein the first driving voltage lines and the second driving voltage lines are alternately arranged in the first direction between the first and second subpixels of a (2N-1)-th pixel among the pixels, between the fourth subpixel of the (2N-1)-th pixel and the first subpixel of a 2N-th pixel among the pixels, between the third and fourth subpixels of the 2N-th pixel, and between the fourth subpixel of the 2N-th pixel and the first subpixel of a (2N+1)-th pixel among the pixels, and N is a positive integer.

25. The display device of claim 22, wherein the first driving voltage lines and the second driving voltage lines are alternately arranged in the first direction between the second and third subpixels of a (2N-1)-th pixel among the pixels, between the fourth subpixel of the (2N-1)-th pixel and the first subpixel of a 2N-th pixel among the pixels, between the second and third subpixels of the 2N-th pixel, and between the fourth subpixel of the 2N-th pixel and the first subpixel of a (2N+1)-th pixel among the pixels, and N is a positive integer.

26. The display device of claim 22, further comprising:
third driving voltage lines extending in the second direction and which receive a third driving voltage, the third driving voltage being different from each of the first and second driving voltages,
wherein the first driving voltage lines, the second driving voltage lines, and the third driving voltage lines are alternately arranged in the first direction.

27. The display device of claim 26, wherein the first driving voltage lines, the second driving voltage lines, and the third driving voltage lines are alternately arranged in the first direction between the first and second subpixels of a (2N-1)-th pixel among the pixels, between the fourth subpixel of the (2N-1)-th pixel and the first subpixel of a 2N-th pixel among the pixels, between the third and fourth subpixels of the 2N-th pixel, and between the fourth subpixel of the 2N-th pixel and the first subpixel of a (2N+1)-th pixel among the pixels, and N is a positive integer.

28. The display device of claim 26, wherein the first driving voltage lines, the second driving voltage lines, and the third driving voltage lines are alternately arranged in the first direction between the second and third subpixels of a (2N-1)-th pixel among the pixels, between the fourth subpixel of the (2N-1)-th pixel and the first subpixel of a 2N-th pixel among the pixels, between the second and third subpixels of the 2N-th pixel, and between the fourth subpixel of the 2N-th pixel and the first subpixel of a (2N+1)-th pixel among the pixels, and N is a positive integer.

29. A display device comprising:
scan lines extending in a first direction;
data lines extending in a second direction that intersects the first direction, and which receive data voltages;
driving voltage lines extending in the second direction and which receive driving voltages; and
subpixels connected to the scan lines, the data lines, and the driving voltage lines,
wherein
each of the subpixels includes a first transistor, which controls a driving current that flows between first and second electrodes of the first transistor in accordance with a voltage applied to a gate electrode of the first transistor, and
one of the driving voltage lines is disposed between the first transistor of one of the subpixels and a data line, among the data lines, connected to a subpixel adjacent to the one of the subpixel.

30. The display device of claim 29, wherein the each of the subpixels further includes a first capacitor connected between a second electrode of the first transistor and a third transistor,
wherein the third transistor is connected between the first capacitor and one of the driving voltage lines.

31. The display device of claim 29, wherein the each of the subpixels further includes a light-emitting element, which is connected between the first transistor and one of the driving voltage lines.

32. The display device of claim 29, wherein the each of the subpixels further includes:
a light-emitting element, which emits light in accordance with the driving current of the first transistor, and
a second transistor, which is connected between a first electrode of the light-emitting element and one of the driving voltage lines.

* * * * *